United States Patent
Inoue et al.

(10) Patent No.: US 11,418,164 B2
(45) Date of Patent: *Aug. 16, 2022

(54) METHODS FOR FABRICATION OF BONDED WAFERS AND SURFACE ACOUSTIC WAVE DEVICES USING SAME

(71) Applicant: Qorvo US, Inc., Greensboro, NC (US)

(72) Inventors: Shogo Inoue, Longwood, FL (US);
Marc Solal, Longwood, FL (US);
Robert Aigner, Ocoee, FL (US)

(73) Assignee: Qorvo US, Inc., Greensboro, NC (US)

( * ) Notice: Subject to any disclaimer, the term of this patent is extended or adjusted under 35 U.S.C. 154(b) by 298 days.

This patent is subject to a terminal disclaimer.

(21) Appl. No.: 16/507,678

(22) Filed: Jul. 10, 2019

(65) Prior Publication Data

US 2019/0334498 A1     Oct. 31, 2019

Related U.S. Application Data

(63) Continuation of application No. 15/087,423, filed on Mar. 31, 2016, now Pat. No. 10,381,998.

(Continued)

(51) Int. Cl.
   *H03H 3/02*    (2006.01)
   *H03H 9/02*    (2006.01)
   (Continued)

(52) U.S. Cl.
   CPC ............... *H03H 3/02* (2013.01); *H03H 3/10* (2013.01); *H03H 9/02574* (2013.01);
   (Continued)

(58) Field of Classification Search
   CPC .. H03H 3/02; H03H 3/08; H03H 3/10; H03H 2003/023; H03H 2003/0435;
   (Continued)

(56) References Cited

U.S. PATENT DOCUMENTS 4,600,853 A    7/1986   Whitlock et al.
5,441,900 A    8/1995   Bulucea et al.
(Continued)

FOREIGN PATENT DOCUMENTS

EP    2490333 A1    8/2012
EP    2658123 A1    10/2013
(Continued)

OTHER PUBLICATIONS

Notice of Reason for Rejection for Japanese Patent Application No. 2018-539285, dated Sep. 18, 2020, 23 pages.
(Continued)

*Primary Examiner* — Peter Dungba Vo
*Assistant Examiner* — Joshua D Anderson
(74) *Attorney, Agent, or Firm* — Withrow & Terranova, P.L.L.C.

(57) ABSTRACT

A method of fabricating a bonded wafer with low carrier lifetime in silicon comprises providing a silicon substrate having opposing top and bottom surfaces, modifying a top portion of the silicon substrate to reduce carrier lifetime in the top portion relative to the carrier lifetime in portions of the silicon substrate other than the top portion, bonding a piezoelectric layer having opposing top and bottom surfaces separated by a distance T over the top surface of the silicon substrate, and providing a pair of electrodes having fingers that are inter-digitally dispersed on a top surface of the piezoelectric layer, the electrodes comprising a portion of a Surface Acoustic Wave (SAW) device. The modifying and bonding steps may be performed in any order. The modified top portion of the silicon substrate prevents the creation of a parasitic conductance within that portion during operation of the SAW device.

29 Claims, 14 Drawing Sheets

Related U.S. Application Data

(60) Provisional application No. 62/197,650, filed on Jul. 28, 2015.

(51) Int. Cl.
*H03H 3/10* (2006.01)
*H03H 9/145* (2006.01)
*H03H 9/17* (2006.01)
*H03H 9/25* (2006.01)
*H03H 9/54* (2006.01)
*H03H 9/64* (2006.01)

(52) U.S. Cl.
CPC .... *H03H 9/02834* (2013.01); *H03H 9/02952* (2013.01); *H03H 9/145* (2013.01); *H03H 9/17* (2013.01); *H03H 9/25* (2013.01); *H03H 9/54* (2013.01); *H03H 9/6406* (2013.01); *Y10T 29/42* (2015.01)

(58) Field of Classification Search
CPC ....... H03H 2003/0464; H03H 9/02543; H03H 9/02566; H03H 9/02574; H03H 9/02614; H03H 9/02622; H03H 9/02834; H03H 9/02952; H03H 9/145; H03H 9/15; H03H 9/17; H03H 9/171; H03H 9/25; H03H 9/54; H03H 9/56; H03H 9/562; H03H 9/64; H03H 9/6406; Y10T 29/42; Y10T 29/49005
See application file for complete search history.

(56) References Cited

U.S. PATENT DOCUMENTS

| | | | |
|---|---|---|---|
| 5,446,330 A | 8/1995 | Eda et al. | |
| 5,475,348 A | 12/1995 | Hode et al. | |
| 5,719,538 A | 2/1998 | Kadota | |
| 6,344,705 B1 | 2/2002 | Solal et al. | |
| 6,445,265 B1 | 9/2002 | Wright | |
| 6,710,509 B1 | 3/2004 | Kadota | |
| 7,105,980 B2 | 9/2006 | Abbott et al. | |
| 7,411,333 B2 | 8/2008 | Kihara et al. | |
| 8,035,464 B1 | 10/2011 | Abbott et al. | |
| 8,115,365 B2 | 2/2012 | Suzuki et al. | |
| 8,456,257 B1 | 6/2013 | Fattinger | |
| 9,319,023 B2 | 4/2016 | Tanaka | |
| 9,438,201 B2 | 9/2016 | Hori et al. | |
| 9,503,049 B2 | 11/2016 | Nishii et al. | |
| 10,084,427 B2 | 9/2018 | Solal et al. | |
| 10,381,998 B2 * | 8/2019 | Inoue | H03H 3/02 |
| 2007/0296306 A1 | 12/2007 | Hauser et al. | |
| 2008/0252394 A1 | 10/2008 | Tajima et al. | |
| 2009/0096046 A1 | 4/2009 | Heringa et al. | |
| 2009/0236935 A1 | 9/2009 | Kando | |
| 2010/0141086 A1 | 6/2010 | Suzuki et al. | |
| 2010/0289379 A1 | 11/2010 | Owaki et al. | |
| 2012/0032759 A1 | 2/2012 | Nishii et al. | |
| 2012/0038435 A1 | 2/2012 | Yata et al. | |
| 2013/0049533 A1 | 2/2013 | Matsuda et al. | |
| 2013/0207747 A1 | 8/2013 | Nishii et al. | |
| 2013/0285768 A1 | 10/2013 | Watanabe et al. | |
| 2014/0145557 A1 | 5/2014 | Tanaka | |
| 2014/0152146 A1 | 6/2014 | Kimura et al. | |
| 2014/0167565 A1 | 6/2014 | Iwamoto | |
| 2014/0210317 A1 | 7/2014 | Tai et al. | |
| 2015/0069882 A1 | 3/2015 | Umeda et al. | |
| 2015/0102705 A1 | 4/2015 | Iwamoto et al. | |
| 2016/0380611 A1 | 12/2016 | Kai | |
| 2017/0033756 A1 | 2/2017 | Inoue et al. | |
| 2017/0033764 A1 | 2/2017 | Inoue et al. | |
| 2017/0222618 A1 | 8/2017 | Inoue et al. | |
| 2017/0222622 A1 | 8/2017 | Solal et al. | |
| 2018/0102760 A1 | 4/2018 | Inoue et al. | |
| 2018/0109241 A1 | 4/2018 | Inoue et al. | |
| 2018/0109242 A1 | 4/2018 | Solal et al. | |
| 2018/0159495 A1 | 6/2018 | Inoue et al. | |
| 2018/0337654 A1 | 11/2018 | Solal et al. | |

FOREIGN PATENT DOCUMENTS

| | | | |
|---|---|---|---|
| FR | 2788176 A1 | 7/2000 | |
| JP | H06326553 A | 11/1994 | |
| JP | 2002076835 A | 3/2002 | |
| JP | 2006319679 A | 11/2006 | |
| JP | 2007028538 A | 2/2007 | |
| JP | 2015073331 A | 4/2015 | |
| JP | 5713025 B2 | 5/2015 | |
| WO | 2008078481 A1 | 7/2008 | |
| WO | 2010004741 A1 | 1/2010 | |
| WO | 2010125934 A1 | 11/2010 | |
| WO | 2011037145 A1 | 3/2011 | |
| WO | 2011046117 A1 | 4/2011 | |
| WO | 2012086639 A1 | 6/2012 | |
| WO | 2013172251 A1 | 11/2013 | |
| WO | 2017132183 A1 | 8/2017 | |
| WO | 2017132184 A1 | 8/2017 | |

OTHER PUBLICATIONS

Notice of Reason for Rejection for Japanese Patent Application No. 2018-539290, dated Sep. 2, 2020, 21 pages.
Corrected Notice of Allowability for U.S. Appl. No. 16/130,433, dated Nov. 24, 2020, 5 pages.
Non-Final Office Action for U.S. Appl. No. 16/037,259, dated Dec. 4, 2020, 14 pages.
Notice of Reason for Rejection for Japanese Patent Application No. 2018-539285, dated Feb. 1, 2021, 11 pages.
Notice of Allowance for U.S. Appl. No. 15/087,225, dated Oct. 9, 2019, 8 pages.
Notice of Allowance for U.S. Appl. No. 16/130,433, dated Jul. 30, 2020, 9 pages.
Examination Report for European Patent Application No. 18196819.9, dated Jul. 1, 2020, 4 pages.
Notice of Reason for Rejection for Japanese Patent Application No. 2018-539290, dated Jan. 4, 2021, 6 pages.
Corrected Notice of Allowability for U.S. Appl. No. 15/087,225, dated Jan. 28, 2020, 4 pages.
Final Office Action for U.S. Appl. No. 16/037,259, dated May 12, 2021, 14 pages.
Decision to Grant for Japanese Patent Application No. 2018-539290, dated Mar. 29, 2021, 5 pages.
Author Unknown, "What is SAW Filters: Advantage of Token Piezoelectric SAW Devices," Token, Version 2010, 5 pages.
Author Unknown, "Working principles and Applications of SAW/FBAR Devices," TaiyoYuden, Navigator, Section 2, Aug. 11, 2014, pp. 10-15.
Chen, Jing et al., "Suppression Rayleigh Wave Spurious Signal in SH-SAW Devices Employing PMN-33%PT crystals," Proceedings of Symposium on Ultrasonic Electronics, vol. 31, Issue 2010, Dec. 6-8, 2010, pp. 287-288.
Emam, Mostafa, "RF SOI: from Material to ICs—an Innovative Characterization Approach," FD-SOI and RF-SOI Forum, Feb. 27, 2015, 35 pages.
Gong, Songbin et al., "Overmoded Shear Horizontal Wave MEMS Resonators using X-Cut Lithium Niobate Thin Film," 2014 IEEE International Ultrasonics Symposium (IUS), Sep. 3-6, 2014, pp. 568-571.
Kadota, Michio, et al., "Improved Quality Factor of Hetero Acoustic Layer (HAL) Saw Resonator Combining LiTaO3 Thin Plate and Quartz Substrate," International Ultrasonics Symposium, Washington, DC, Sep. 6-9, 2017, IEEE, 4 pages.
Hayashi, Junki, et al., "High Coupling and Highly Stable Leaky Saws on LiTaO3 Thin Plate Bonded to Quartz Substrate," Proceedings of Symposium on Ultrasonic Electronics, vol. 38, Oct. 2017, IEEE, 2 pages.
Malocha, Donald C., "Surface Acoustic Wave Technology and Wireless Applications," Presentation at the University of South Florida, Nov. 14, 2001, 145 pages.

(56) References Cited

OTHER PUBLICATIONS

Miura, M. et al., "Temperature Compensated LiTaO3/Sapphire Bonded SAW Substrate with low Loss and High Coupling Factor Suitable for US-PCS Application," 2004 IEEE Ultrasonics Symposium, vol. 2, Aug. 23-27, 2004, pp. 1322-1325.

Pastureaud, Thomas et al., "High-Frequency Surface Acoustic Waves Excited on Thin-Oriented LiNbO3 Single-Crystal Layers Transferred Onto Silicon," IEEE Transactions on Ultrasonics, Ferroelectrics, and Frequency Control, vol. 54, No. 4, Apr. 2007, pp. 870-876.

Reinhardt, Alexandre et al., "Acoustic filters based on thin single crystal $LiNbO_3$ films: Status and prospects," 2014 IEEE International Ultrasonics Symposium (IUS), Sep. 3-6, 2014, pp. 773-781.

Solal, M. et al., "Oriented lithium niobate layers transferred on 4" (100) silicon waferfor RF SAW devices," Proceedings of the 2002 IEEE Ultrasonics Symposium, vol. 1, Oct. 2002, IEEE, pp. 131-134.

Takai, Tsutomu, et al., "Incredible High Performance SAW resonator on Novel Multi-layerd Substrate," International Ultrasonics Symposium Proceedings, Sep. 18-21, 2016, Tours, France, IEEE, 4 pages.

Takai, Tsutomu, et al., "I.H.P.SAW Technology and its Application to Microacoustic Components (Invited)," International Ultrasonics Symposium, Sep. 6-9, 2017, Washington DC, IEEE, 8 pages.

Non-Final Office Action for U.S. Appl. No. 15/086,895, dated Dec. 15, 2017, 6 pages.

Notice of Allowance for U.S. Appl. No. 15/086,936, dated Jul. 9, 2018, 8 pages.

Non-Final Office Action for U.S. Appl. No. 15/087,225, dated Jun. 21, 2018, 5 pages.

Non-Final Office Action for U.S. Appl. No. 15/087,423, dated Jul. 31, 2018, 17 pages.

International Search Report and Written Opinion for International Patent Application No. PCT/US2017/014806, dated Apr. 21, 2017, 12 pages.

International Preliminary Report on Patentability for PCT/US2017/014806, dated Aug. 9, 2018, 9 pages.

International Preliminary Report on Patentability for PCT/US2017/014808, dated Aug. 9, 2018, 6 pages.

International Search Report and Written Opinion for International Patent Application No. PCT/US2017/014808, dated Apr. 19, 2017, 9 pages.

Gomi, Masashi, et al., "High-Coupling Leaky SAWs on LiNbO3 or LiTaO3 Thin Plate Bonded to High-Velocity Substrate," Proceedings of Symposium on Ultrasonic Electronics, vol. 37, Nov. 16-18, 2016, 2 pages.

Gomi, Mashashi, et al., "High-coupling leaky surface acoustic waves on LiNBO3 or LiTaO3 thin plate bonded to high-velocity substrate," Japanese Journal of Applied Physics, vol. 56, Jun. 27, 2017, Japan Society of Applied Physics, 7 pages.

Hayashi, Junki, et al., "High-Coupling Leaky SAWs on LiTaO3 Thin Plate Bonded to Quartz Substrate," International Ultrasonics Symposium, Sep. 6-9, 2017, Washington, DC, IEEE, 4 pages.

Kadota, Micho, et al., "HAL SAW Resonators Using 42oYX-LiTaO3 Thin Plate on Quartz Substrate," International Frequency Control Symposium, Jul. 9-13, 2017, Besancon, France, IEEE, 2 pages.

Non-Final Office Action for U.S. Appl. No. 15/087,225, dated Feb. 8, 2019, 9 pages.

Ex Parte Quayle Action for U.S. Appl. No. 15/087,225, mailed Aug. 23, 2019, 5 pages.

Final Office Action for U.S. Appl. No. 15/087,423, dated Jan. 18, 2019, 14 pages.

Non-Final Office Action for U.S. Appl. No. 16/048,520, dated Mar. 5, 2019, 5 pages.

Notice of Allowance for U.S. Appl. No. 16/048,520, dated Jun. 7, 2019, 7 pages.

Extended European Search Report for European Patent Application No. 18196819.9, dated Mar. 1, 2019, 12 pages.

Notice of Allowance for U.S. Appl. No. 16/037,259, dated Aug. 18, 2021, 7 pages.

Notice of Reason for Rejection for Japanese Patent Application No. 2018-539285, dated Aug. 4, 2021, 7 pages.

Decision to Grant for Japanese Patent Application No. 2018-539285, dated Mar. 2, 2022, 5 pages.

Intention to Grant for European Patent Application No. 18196819.9, dated Apr. 12, 2022, 7 pages.

\* cited by examiner

METHODS FOR FABRICATION OF BONDED WAFERS AND SURFACE ACOUSTIC WAVE DEVICES USING SAME

RELATED APPLICATIONS

This application is a continuation of U.S. patent application Ser. No. 15/087,423, filed Mar. 31, 2016, which claims the benefit of provisional patent application Ser. No. 62/197,650, filed Jul. 28, 2015, the disclosures of which are hereby incorporated herein by reference in their entireties.

This application is related to commonly owned and assigned U.S. patent application Ser. No. 15/087,225, filed Mar. 31, 2016, entitled "BONDED WAFERS AND SURFACE ACOUSTIC WAVE DEVICES USING SAME"; U.S. patent application Ser. No. 15/086,895, filed Mar. 31, 2016, now U.S. Pat. No. 10,084,427, entitled "SURFACE ACOUSTIC WAVE DEVICE HAVING A PIEZOELECTRIC LAYER ON A QUARTZ SUBSTRATE AND METHODS OF MANUFACTURING THEREOF"; and U.S. patent application Ser. No. 15/086,936, filed Mar. 31, 2016, now U.S. Pat. No. 10,128,814, entitled "GUIDED SURFACE ACOUSTIC WAVE DEVICE PROVIDING SPURIOUS MODE REJECTION," which are hereby incorporated herein by reference in their entireties.

FIELD OF THE DISCLOSURE

The subject matter of the present disclosure relates to composite structures having a resistance to the creation of a parasitic conductance between a piezoelectric layer and a silicon support substrate and to Surface Acoustic Wave (SAW) filters implemented using these structures.

BACKGROUND

Surface Acoustic Wave (SAW) filters are used in many applications such as Radio Frequency (RF) filters. For example, SAW filters are commonly used in Second Generation (2G), Third Generation (3G), or Fourth Generation (4G) wireless transceiver front ends, duplexers, and receive filters. The widespread use of SAW filters is due, at least in part, to the fact that SAW filters exhibit low insertion loss with good rejection, can achieve broad bandwidths, and are a small fraction of the size of traditional cavity and ceramic filters. Usually, SAW filters use resonators at the surface of a piezoelectric crystal. The resonators may be coupled electrically to form a so-called impedance element filter or ladder filter. They may also be coupled acoustically by inserting several transducers between two reflectors, in which case, they form a Coupled Resonator Filter (CRF), also sometimes called a Double Mode SAW filter (DMS). Hybrid architectures that cascade CRF stage and ladder stages may be used. The performance of the filter is depending on the individual resonators characteristics.

Several parameters are important for a SAW resonator. One important parameter is the effective piezoelectric coupling factor ($K^2$), which depends on the ratio between antiresonance and resonance frequency. SAW resonators with larger coupling factors have larger frequency shifts between resonance and antiresonance and can be used to design wide-band filters. The coupling factor mostly depends on the chosen piezoelectric substrate. Larger $K^2$ make possible the design of filters with a larger fractional bandwidth. Another important parameter of a SAW resonator is the resonator Quality Factor (Q), which influences the insertion losses of a filter designed with the SAW resonator and the steepness of the filter response. Q depends mostly on the acoustic and electric losses in the SAW resonator.

Also, the resonance frequency of a SAW resonator is proportional to the velocity of the SAW. When the temperature changes, the velocity of the wave changes, and the filter shifts in frequency. Additionally, due to thermal expansion, the component dimensions change, leading also to an additional frequency shift. SAW filters need to be able to select a frequency band for a temperature range that is typically a range of 100° Celsius (C) or more. A large thermal sensitivity of the center frequency of a SAW filter results in a filter response shifting in frequency and overall in degraded performances inside a given temperature range. The thermal sensitivity is measured by a coefficient, which is typically referred to as the Thermal Coefficient of Frequency (TCF). Most materials have a negative TCF, meaning that the frequency decreases when the temperature increases.

SAW filters using leaky surface waves have losses due to the radiation of acoustic energy into the bulk substrate. One approach to reduce these losses is to use a piezoelectric film at the surface of a support substrate. For example, guided SAW devices have a layered substrate where a piezoelectric layer is bonded or deposited on (e.g., directly on) the surface of a support, or carrier, substrate. If the acoustic velocity of the support substrate is larger than the acoustic velocity in the piezoelectric film, the acoustic wave is guided inside the film and the losses into the bulk are suppressed. This approach is beneficial only if the piezoelectric film is thin enough. If a thick film is used, several spurious modes, due to higher order modes in the film, exist. Relatively thick films (10 wavelengths or so) may be used to improve the temperature sensitivity but do not provide a significant reduction of the losses.

An improvement on this approach, which is described in the co-filed and commonly-owned patent application U.S. Patent Application entitled "GUIDED SURFACE ACOUSTIC WAVE DEVICE PROVIDING SPURIOUS MODE REJECTION" and which discloses a bonded wafer comprising a piezoelectric layer over a non-semiconductor substrate, is to use piezoelectric thicknesses thinner than one or two wavelengths, which provides suppression of the bulk radiation losses with a limited or no spurious generation. It was discovered that using this technique raised new challenges, however, when used with a semiconductor substrate: if the support substrate is a semiconductor like silicon, the quality factor is limited by a parasitic conductance inside the substrate. This is illustrated in FIGS. 1A and 1B, which are not drawn to scale.

FIG. 1A shows a cross-section view of a SAW device constructed on a conventional bonded wafer 10 having a piezoelectric layer 12 of thickness $T_{OLD}$ over a silicon substrate 14 having a top surface 16. An array of electrodes 18 (only some of which are shown), referred to herein in singularly as the electrode 18 and in plurality as electrodes 18, form electrical connections to the top surface of the piezoelectric layer 12. A parasitic capacitance C exists between electrodes 18 and the silicon substrate 14. FIG. 1A shows a conventional bonded wafer having a thick piezoelectric layer 12, e.g., $T_{OLD}$ is typically more than 10~15 times lambda (λ), which is the wavelength of the center operating frequency of the SAW device and is twice the period of the electrodes, where the "period" is the center-to-center distance between two adjacent electrodes. Due to the bulk resistance of the silicon substrate 14, an inherent resistance R exists within the top surface 16 between parasitic capacitors C. Due to the thickness of the piezoelectric layer 12, the value of C is small and therefore the effect of R on the performance of the device is negligible.

FIG. 1B shows a cross-section view of a SAW device built on a bonded wafer 20 having a very thin piezoelectric layer 12 having a thickness $T_{NEW}$, located above the silicon substrate 14. Compared to the conventional bonded wafer 10, the bonded wafer 20 has a larger parasitic capacitance, C', due to the relative thinness of the piezoelectric layer. It was also discovered that, for a semiconductor substrate such as silicon substrate 14, if $T_{NEW}$ is less than ~2λ, an inversion layer appears, shown in FIG. 1B as the line of electrons or charges located at the top of the silicon substrate 14.

The presence of these additional charges creates a parasitic conductance that reduces the resistance between the capacitors—i.e., the value R' of the bonded wafer 20 is lower than the value of R within the conventional bonded wafer 10—due to the parasitic conductance. The quality factor Q of a SAW filter is affected by R': as the resistance R' goes down, the filter's quality factor drops.

FIGS. 2A and 2B are graphs illustrating the effect that a parasitic channel has on admittance/conductance and Q, respectively, for the bonded wafer 20. In FIGS. 2A and 2B, the solid line represents the performance of the device when the parasitic channel is absent, while the dotted line represents the performance of a device when a parasitic channel is present. When the thickness of the piezoelectric layer is thinner, the influence of the transducer on the silicon substrate becomes larger and the reduction of the quality factor becomes significant. FIGS. 2A and 2B illustrate the effects of a parasitic channel when the piezoelectric layer 12 has a thickness T=0.5λ. In FIG. 2A, it can be seen that the presence of the parasitic channel increases the conductance at antiresonance. In FIG. 2B, it can be seen that the presence of the parasitic channel reduces the quality factor Q drastically.

FIG. 2C is a graph illustrating how the thickness T of the piezoelectric layer 12 affects the value of Q of a SAW resonator. The X-axis shows thickness T of the piezoelectric layer 12 in lambda. The Y-axis shows the ratio of $Q_{PAR}$ to $Q_{NO-PAR}$ in %, where $Q_{PAR}$ is the Q when the parasitic conductance is present and $Q_{NO-PAR}$ is the Q when the parasitic conductance is not present. If the thickness T of the piezoelectric layer 12 is more than 2×λ, Q is essentially unaffected. As can be seen in FIG. 2C, however, if T is less than 2×λ, Q becomes progressively degraded as T is reduced, due to the presence of the parasitic channel. FIG. 2C shows that, without a parasitic channel present, the value of Q would have remained constant regardless of the thickness of the piezoelectric layer 12.

Thus, the presence of the parasitic conductance causes the appearance of high conductivity paths that reduce the Q of the SAW resonators, which degrades the filter's performance. For SAW devices on bonded wafer 20, the piezoelectric layer 12 must have a thickness of at least 2×λ to avoid the creation of the parasitic conductance and the degradation of Q that is caused by the presence of the parasitic channel. Because the piezoelectric layer 12 of a bonded wafer 20 used for SAW filters must be at least 2λ thick, it is not possible to further reduce the thickness of the piezoelectric layer 12 in an effort to suppress the higher order modes in the piezoelectric film and to reduce the loss and thus enhance device performance.

Therefore, there is a need for a bonded wafer that resists the creation of a parasitic conductance at the top surface of the bulk silicon substrate during operation of the SAW filter so that a thinner piezoelectric layer may be used without degrading the performance of the SAW filter. One solution is to use a bonded wafer with low carrier lifetime in silicon.

SUMMARY

The present disclosure relates to methods of fabrication of a bonded wafer with low carrier lifetime in silicon and SAW devices implemented using these structures.

According to one embodiment of the subject matter disclosed herein, a method of fabricating a bonded wafer with low carrier lifetime in silicon comprises providing a silicon substrate having opposing top and bottom surfaces, modifying a top portion of the silicon substrate to reduce carrier lifetime in the top portion relative to the carrier lifetime in portions of the silicon substrate other than the top portion, bonding a piezoelectric layer having opposing top and bottom surfaces separated by a distance T over the top surface of the silicon substrate, and providing a pair of electrodes having fingers that are inter-digitally dispersed on a top surface of the piezoelectric layer in a pattern having a center-to-center distance D between adjacent fingers of the same electrode, the electrodes comprising a portion of a Surface Acoustic Wave (SAW) device. The modified top portion of the silicon substrate prevents the creation of a parasitic conductance within the top portion of the silicon substrate during operation of the SAW device. The modifying and bonding steps may be performed in any order, i.e., the top portion of the silicon substrate may be modified before the piezoelectric layer is bonded over it or after the piezoelectric layer is bonded over it (e.g., modification of the top portion of the silicon substrate may be via implantation through the piezoelectric layer).

In one embodiment, the thickness of the modified portion is at least 10 nanometers. In another embodiment, the thickness of the modified portion is at least 50 nanometers. In yet another embodiment, the thickness of the modified portion is at least 200 nanometers.

In one embodiment, providing the piezoelectric layer comprises providing a layer comprising quartz, lithium niobate ($LiNbO_3$), or lithium tantalate ($LiTaO_3$).

In one embodiment, the silicon substrate is monocrystalline and where modifying the top portion of the silicon substrate comprises modifying the top portion to be non-monocrystalline. In one embodiment, the top portion is modified to have a defect density in a range from 1e17/cm$^3$ to 1e22/cm$^3$. In one embodiment, modifying the top portion of the silicon substrate comprises modification by damage implantation. In one embodiment, modifying the top portion of the silicon substrate comprises modification by growth or deposition of polycrystalline silicon, nanocrystalline silicon, and/or amorphous silicon.

In one embodiment, modifying the top portion of the silicon substrate comprises modification by inclusion of deep trap impurities. In one embodiment, the top portion is modified to have an impurity density in a range from 1e15/cm$^3$ to 1e18/cm$^3$.

In one embodiment, the modified top portion has a carrier lifetime of less than 100 nanoseconds.

In one embodiment, thickness of the piezoelectric layer T is less than 2*D. In one embodiment, T is greater than (0.10*D) for bonded wafers without an insulation layer, and T is greater than (0.05*D) for bonded wafers that include an insulation layer. In one embodiment, T is less than (1.76−2.52e−4*($V_{SUB}$+4210−$V_{PIEZO}$))*D, where $V_{SUB}$ is the velocity of the slowest acoustic wave in the propagation direction in the substrate and $V_{PIEZO}$ is the SAW velocity in the piezoelectric layer.

In one embodiment, the method further comprises providing an insulation layer between the silicon substrate and the piezoelectric layer. The modifying and providing an insulation layer steps may be performed in any order. In one embodiment, providing the insulation layer between the silicon substrate and the piezoelectric layer comprises growing or depositing the insulation layer on the top surface of the silicon substrate prior to bonding the piezoelectric layer to the top surface of the insulation layer. In one embodiment, providing the insulation layer between the silicon substrate and the piezoelectric layer comprises growing or depositing the insulation layer on the bottom surface of the piezoelectric layer before bonding the insulation layer to the top surface of the silicon substrate. In one embodiment, providing the insulation layer comprises providing a layer of silicon oxide ($SiO_x$). In embodiments with an insulation layer T may be less than $(1.76-2.52e-4*(V_{SUB}+4210-V_{PIEZO})-(0.50*T_I))*D$, where $V_{SUB}$ is the velocity of the slowest acoustic wave in the propagation direction in the substrate, $V_{PIEZO}$ is the SAW velocity in the piezoelectric layer, and $T_I$ is the thickness of the insulation layer. In one embodiment, $T_I<(0.1*D)$.

In one embodiment, the method further comprises embedding or covering the pair of electrodes by at least one dielectric, insulation, or passivation layer.

In one embodiment, the method further comprises doping at least one insulation, dielectric, or passivation layer with Fluorine or Boron compounds.

Those skilled in the art will appreciate the scope of the present disclosure and realize additional aspects thereof after reading the following detailed description in association with the accompanying drawings.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 9A:
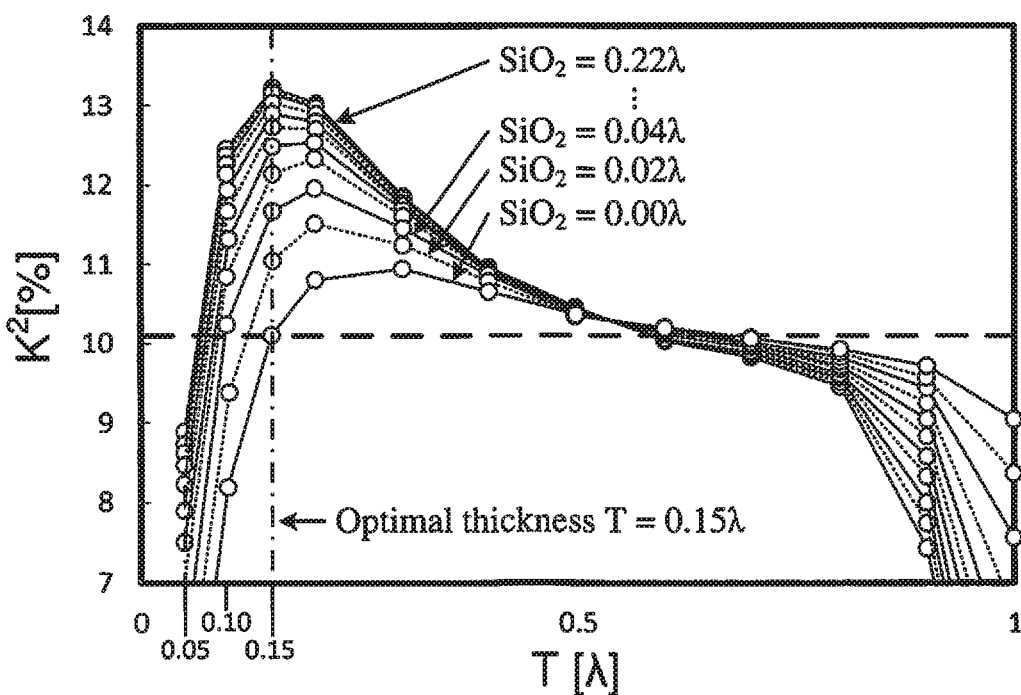
Figure 9B:
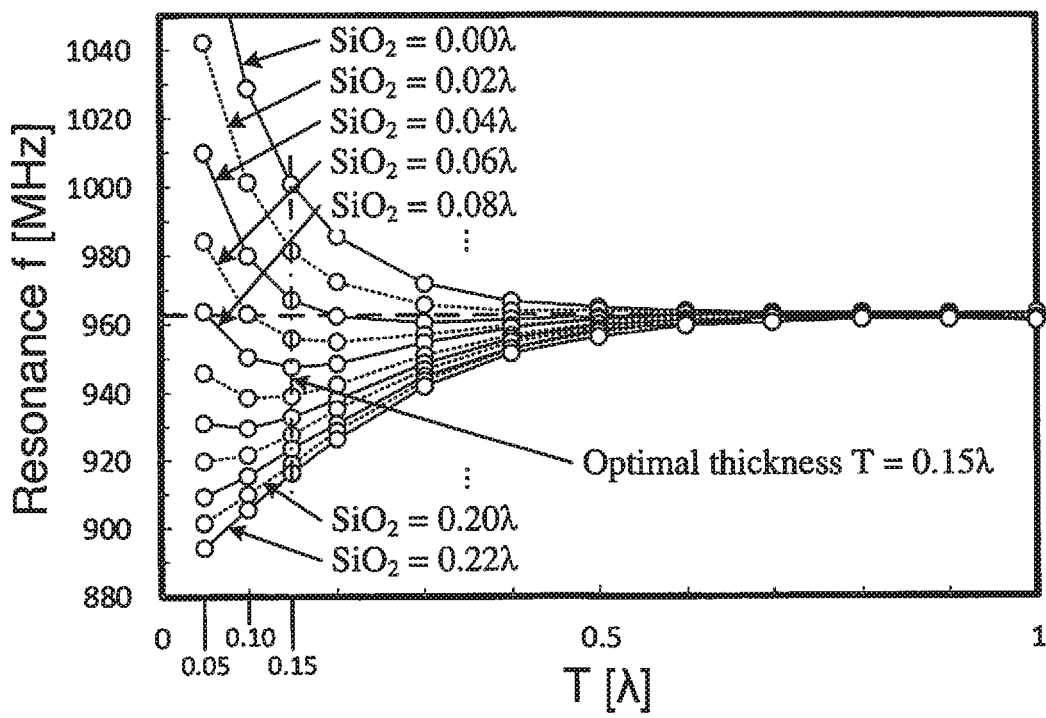
Figure 10A:
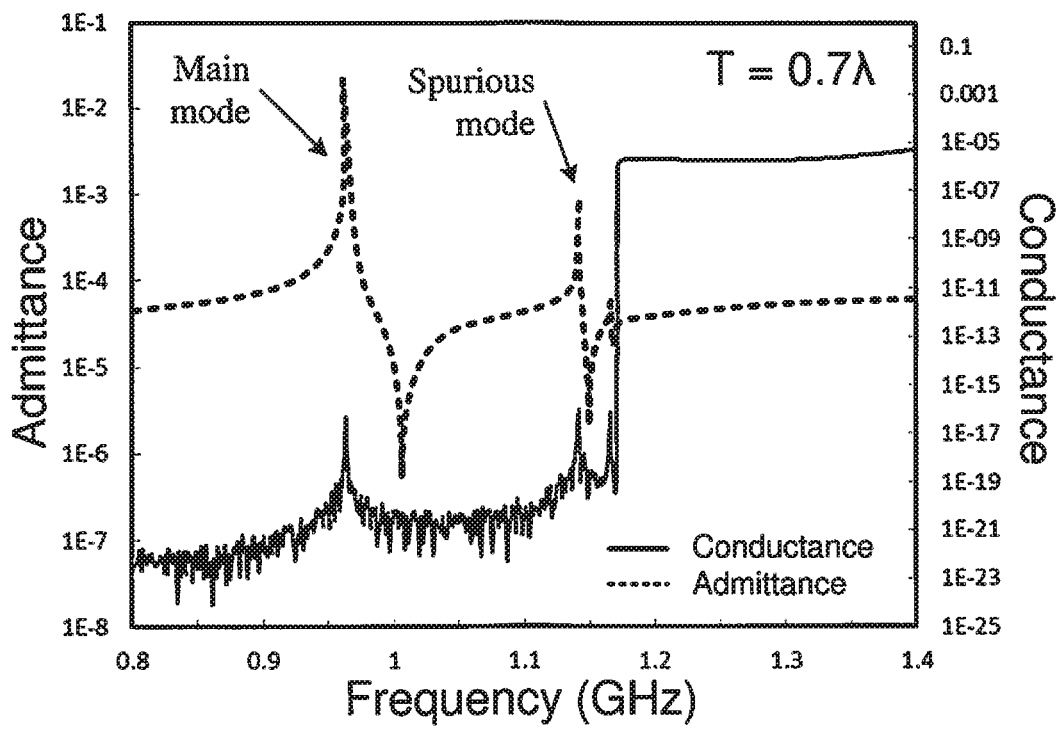
Figure 10B:
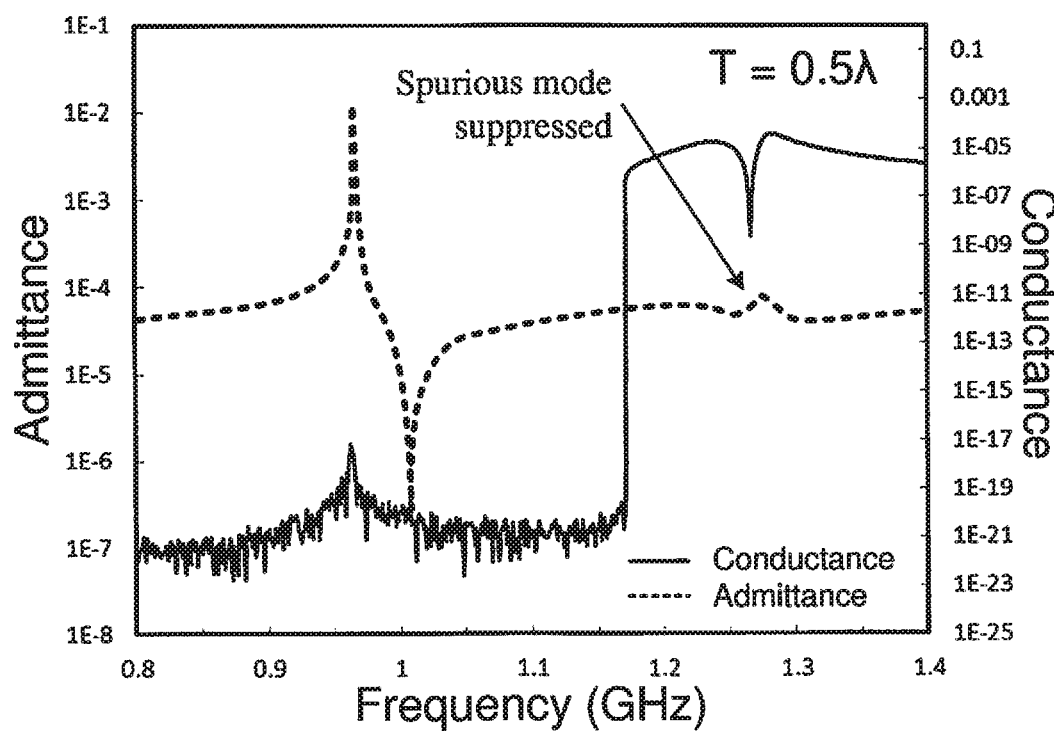
Figure 11:
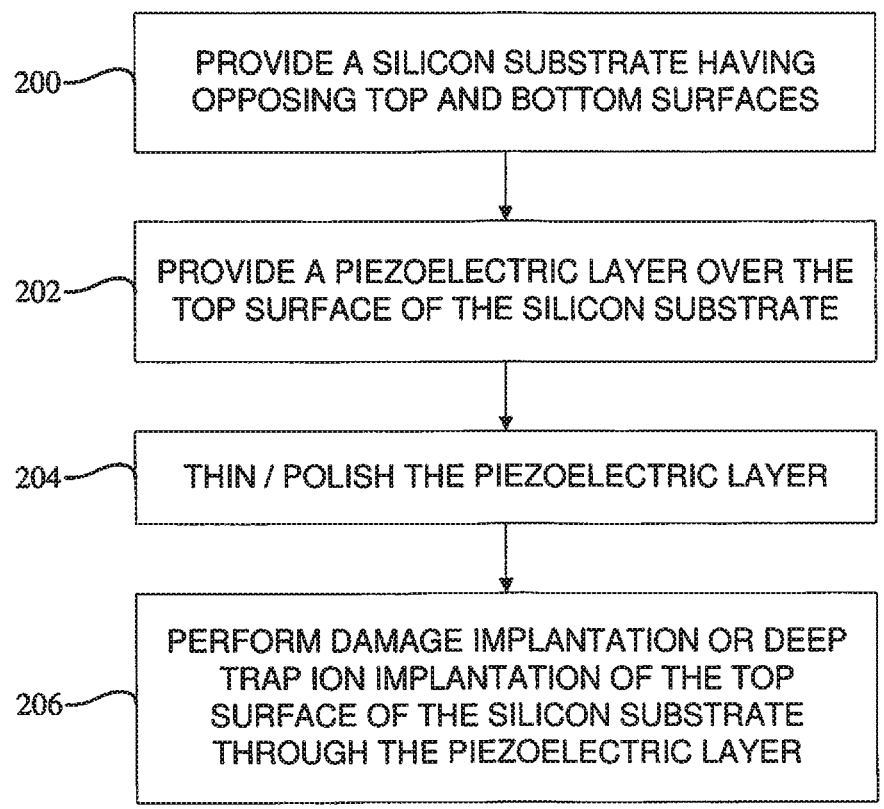
Figure 12:
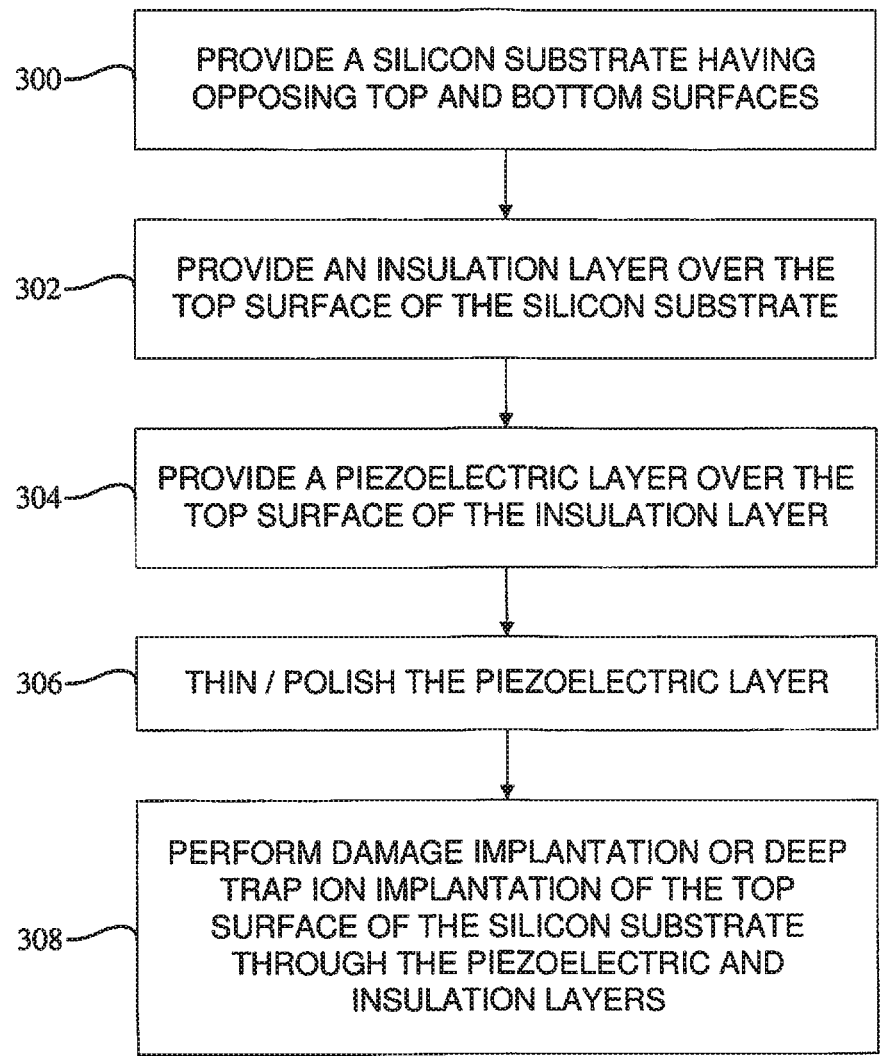
Figure 13:
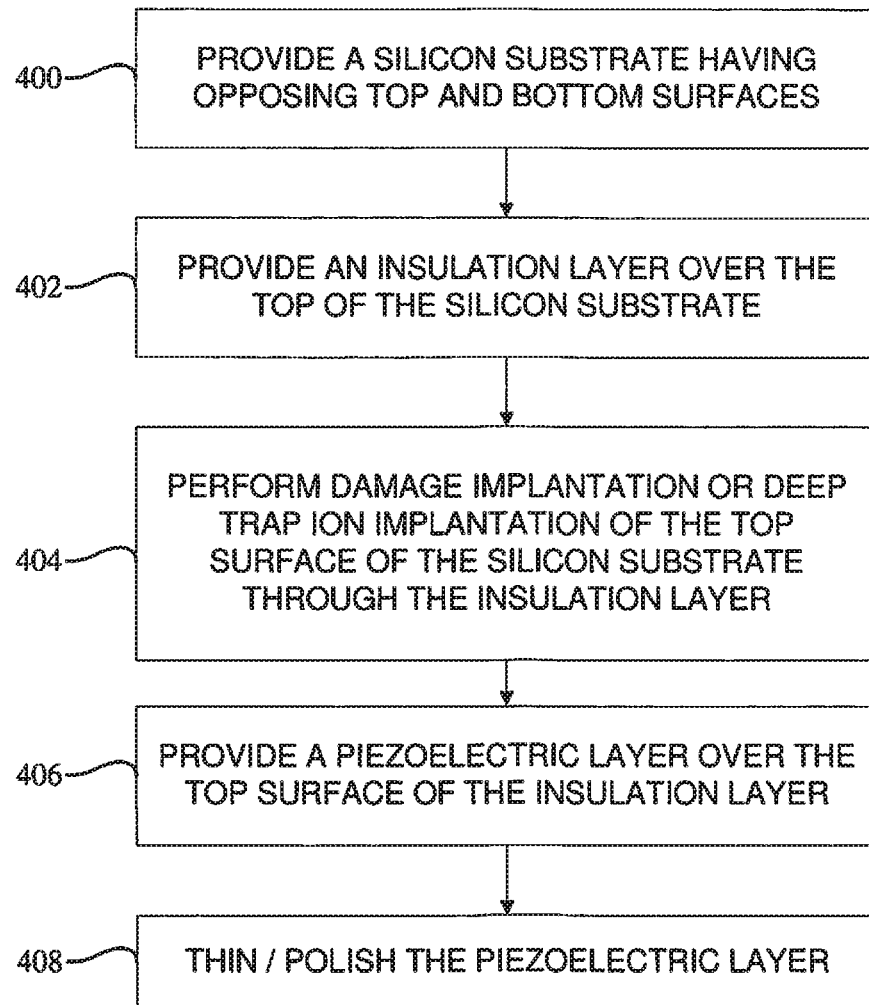

FIGS. 9A and 9B are graphs illustrating the performance of a bonded wafer with different thicknesses of piezoelectric and insulation layers according to embodiments of the subject matter described herein; and FIGS. 10A and 10B are graphs showing how proper selection of piezoelectric layer thickness can further improve the performance of the SAW device according to embodiments of the subject matter described herein;

FIG. 11 is a flow chart illustrating an exemplary process for fabricating a bonded wafer with low carrier lifetime according to another embodiment of the subject matter described herein;

FIG. 12 is a flow chart illustrating an exemplary process for fabricating a bonded wafer with low carrier lifetime according to yet another embodiment of the subject matter described herein; and FIG. 13 is a flow chart illustrating an exemplary process for fabricating a bonded wafer with low carrier lifetime according to still another embodiment of the subject matter described herein.

Those skilled in the art will recognize improvements and modifications to the present disclosure. All such improvements and modifications are considered within the scope of the concepts disclosed herein.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present.

It will also be understood that when an element is referred to as being "connected" or "coupled" to another element, it can be directly connected or coupled to the other element or there may be intervening elements present. In contrast, when an element is referred to as being "directly connected" or "directly coupled" to another element, there are no intervening elements present.

It will also be understood that although relative terms such as "above," "below," "top," "middle," "intermediate," "bottom," "upper," "lower," "horizontal," "vertical," "left," "center," "right," and the like may be used herein to describe a relationship of one element, layer, or region to another element, layer, or region as illustrated in the Figures, these elements should not be limited by these terms. It will be understood that these terms and those discussed above are intended to encompass different orientations of the device in addition to the orientation depicted in the Figures. For example, a first element could be termed an "upper" element and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 3:
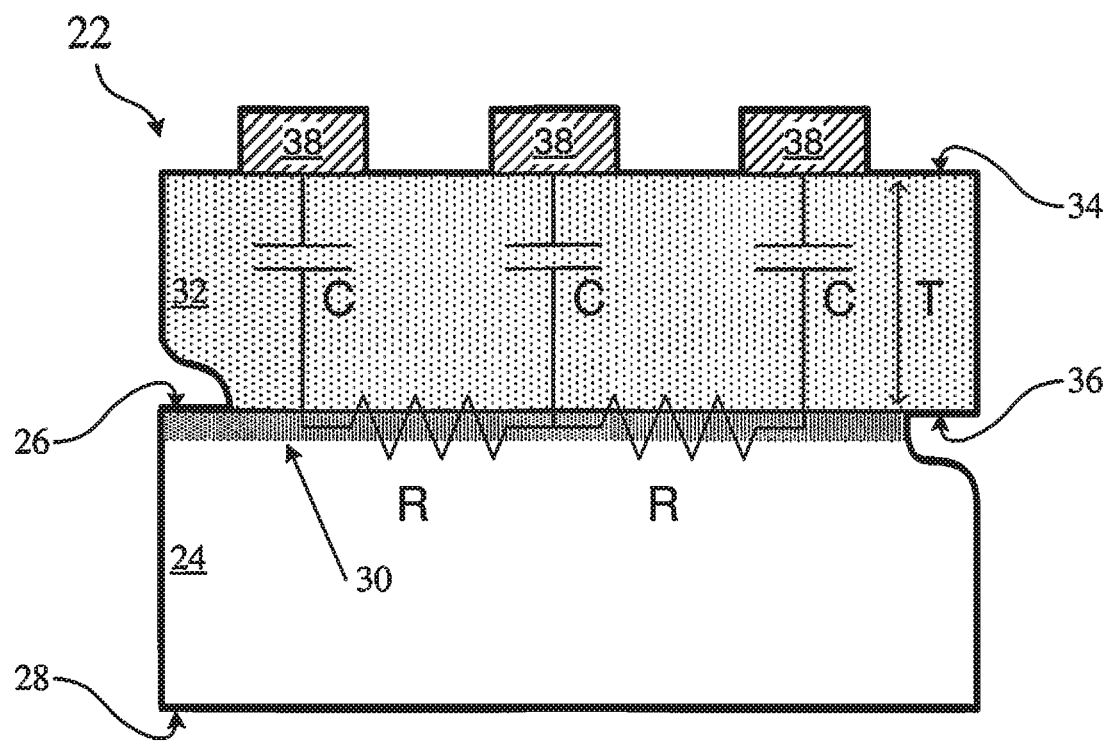
FIG. 3 illustrates a cross-section view of an exemplary bonded wafer with low carrier lifetime in silicon according to an embodiment of the subject matter described herein.

FIG. 3 illustrates a cross-section view of an exemplary bonded wafer 22 with low carrier lifetime in silicon according to an embodiment of the subject matter described herein. In the embodiment illustrated in FIG. 3, the exemplary bonded wafer 22 includes a silicon substrate 24 having an opposing top surface 26 and bottom surface 28. The top of silicon substrate 24 has been modified or treated to reduce the carrier lifetime in a top portion 30 of the silicon substrate 24 (hereinafter referred to simply as "the top portion 30" for brevity) relative to the carrier lifetime in portions of the silicon substrate 24 other than the top portion 30. It should be noted that the thickness of the top portion 30 is not to scale: in one embodiment, the top portion 30 is about 300 nm thick, but this thickness is greatly exaggerated for the purposes of illustration here. Thicknesses of 50 nm have also been shown to work.

A piezoelectric layer 32 having an opposing top surface 34 and bottom surface 36 is bonded over the silicon substrate 24. The piezoelectric layer 32 has a thickness, T. The relative thicknesses of the silicon substrate 24, the top portion 30, and the piezoelectric layer 32 are also not to scale. In one embodiment, the piezoelectric layer 32 comprises lithium tantalate ($LiTaO_3$), also referred to as "LT". Other materials that may be used for the piezoelectric layer 32 include, but are not limited to, quartz and lithium niobate ($LiNbO_3$), also referred to as "LN". In some embodiments, the piezoelectric layer is formed of LT with an orientation between Y and Y+60 degrees. In other embodiments, the piezoelectric layer is formed of LN with an orientation between Y−20 degrees and Y+60 degrees.

Figure 1A:
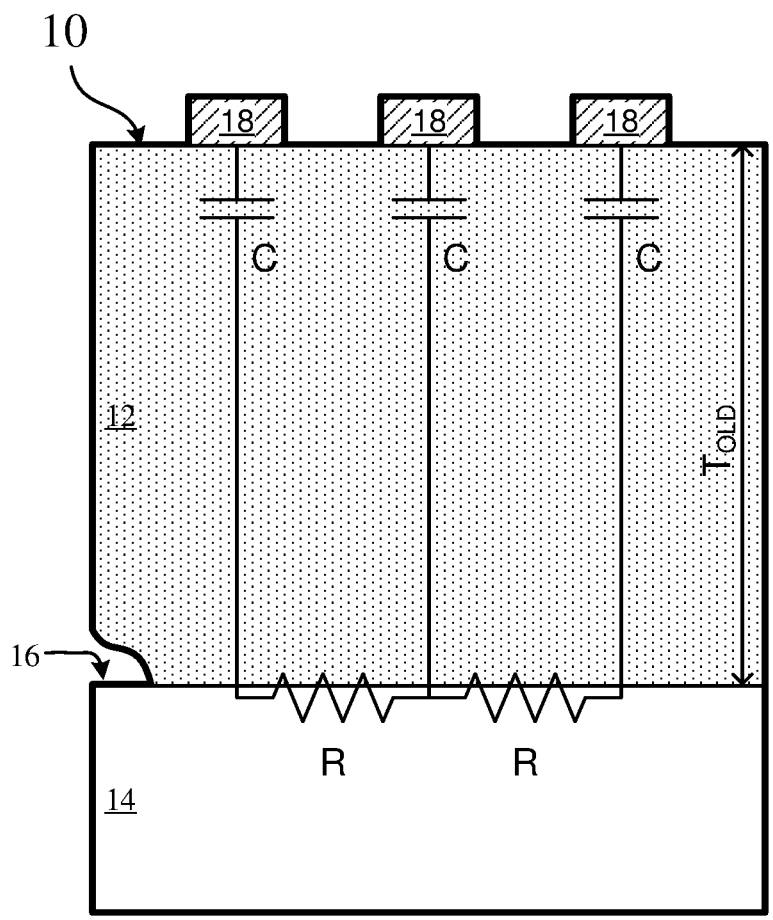
FIG. 1A shows a cross-section view of a SAW device constructed on a conventional bonded wafer 10 having a thick piezoelectric layer over a silicon substrate.
Figure 1B:
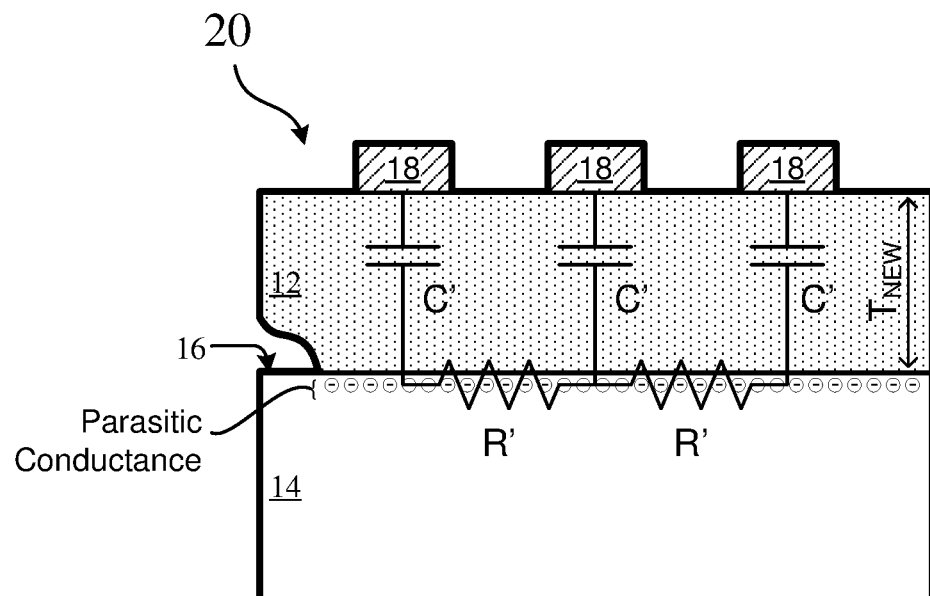
FIG. 1B shows a cross-section view of a SAW device built on a bonded wafer 20 having a very thin piezoelectric layer above the silicon substrate.
Figure 2A:
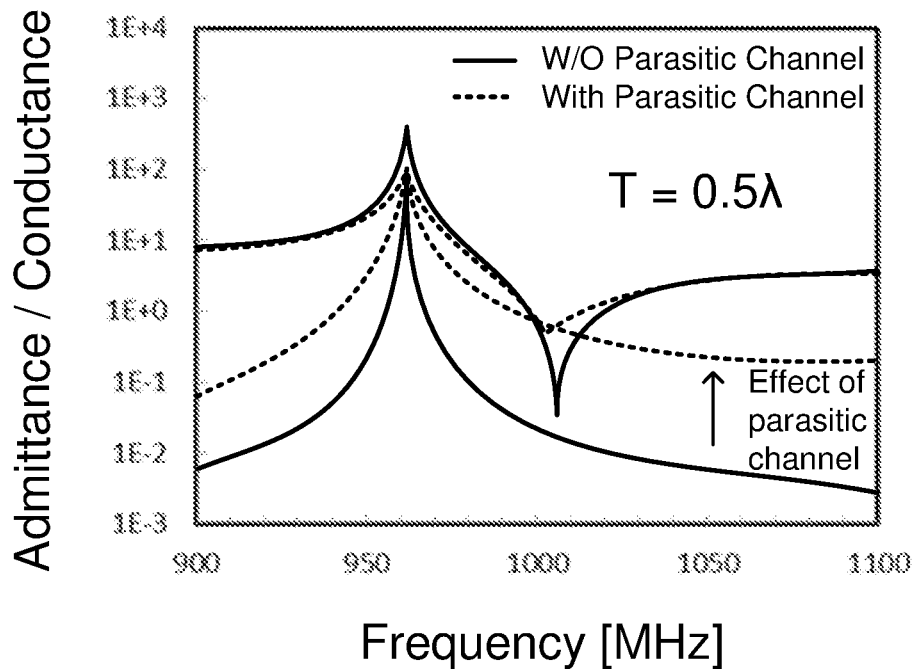
FIGS. 2A and 2B are graphs illustrating the effect that a parasitic channel has on admittance/conductance and Q, respectively, for a bonded wafer 20.
Figure 2B:
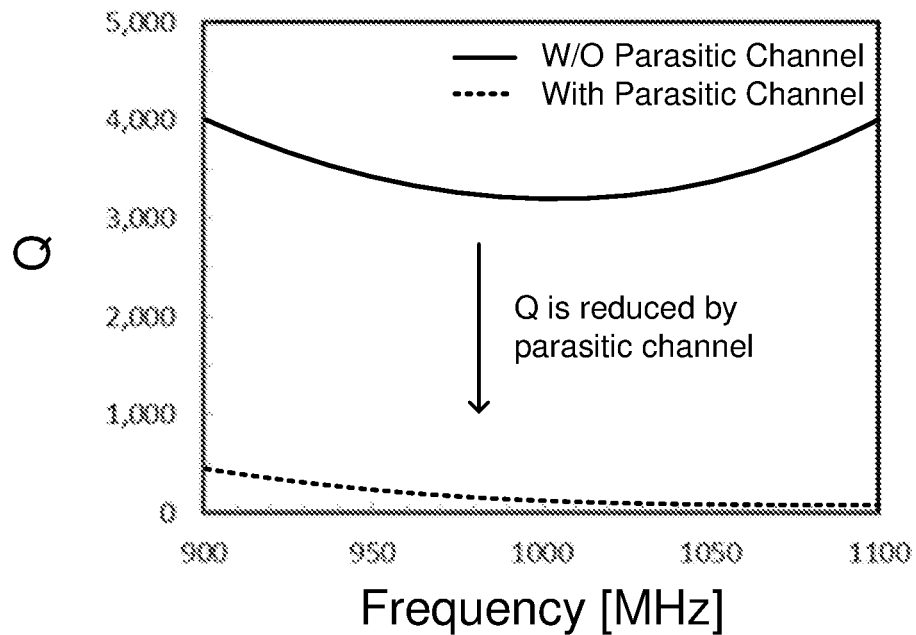
Figure 2C:
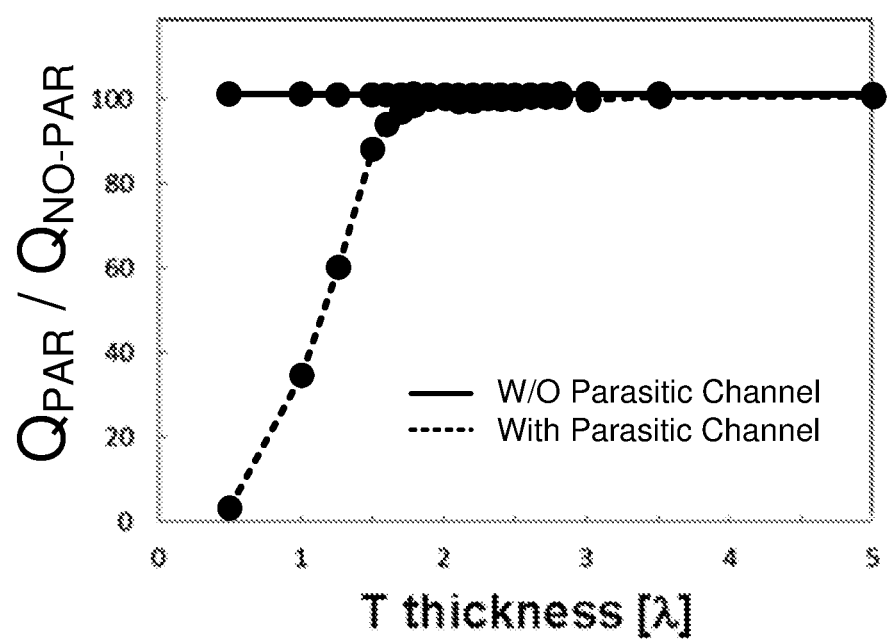
FIG. 2C is a graph illustrating how the thickness T of the piezoelectric layer affects the value of Q of a SAW resonator.

Unlike the conventional bonded wafer 10 illustrated in FIGS. 1A and 1B, the exemplary bonded wafer 22 is resistant or immune to the creation of the parasitic conductance shown in FIG. 1B. Under the influence of an electric field through or normal to the top surface of the piezoelectric layer 32, which may be generated when a voltage is applied to electrodes 38, the top portion 30 prevents the creation of a parasitic conductance within the top 26 of the silicon substrate 24. This means that SAW devices that are built using the exemplary bonded wafer 22 can be made with a piezoelectric layer 32 that is less than 2×λ thick with no degradation of Q. Such devices can have a piezoelectric layer 32 that is as thin as 0.10λ. As will be described in more detail below, with the addition of an insulation layer between the piezoelectric layer 32 and the silicon substrate 24, the piezoelectric layer 32 can be as thin as 0.05λ.

The top 26 of the silicon substrate 24 may be treated in several different ways to reduce carrier lifetime. In one embodiment, the silicon substrate 24 is monocrystalline and the top portion 30 has been modified to be non-monocrystalline. In one embodiment, this is achieved by subjecting the top portion 30 to damage implantation, e.g., by implanting silicon (Si), argon (Ar), nitrogen (N), oxygen (O), neon (Ne), beryllium (Be), carbon (C), or krypton (Kr) ions. Proton implantation may be used as well. Implantation destroys or fractures the regular crystalline structure of the top portion 30. In one embodiment, damage implantation may be performed until the top portion 30 has a defect density sufficient to impair the ability of the top portion 30 to behave like a semiconductor. In one embodiment, damage implantation may be performed until the top portion 30 has a defect density in a range from $1e17/cm^3$ to $1e22/cm^3$.

In another embodiment, the top portion 30 of the silicon substrate 24 has been modified by the growth or deposition of polycrystalline silicon, nanocrystalline silicon, and/or amorphous silicon. Unlike monocrystalline silicon, which has no grain boundaries due to its regular crystal structure, polycrystalline silicon has large grains and amorphous silicon has small grains. In one embodiment, the polycrystalline silicon has a grain size of 5 micrometers or less. These grain boundaries also impair the ability of the top portion 30 to behave like a semiconductor. The breaks in the regular crystalline structure that are caused by damage implantation and that are inherent in polycrystalline and amorphous silicon are locations within the crystal which may trap free carriers, reducing the carrier lifetime. Rapid Thermal Annealing (RTA)-crystallized polysilicon is another suitable modification or treatment. Likewise, the regular crystalline structure may be made irregular by etching or other mechanical and/or chemical process.

Another way to treat the top portion 30 of silicon substrate 24 in order to reduce carrier lifetime is by inclusion of deep trap impurities. In this technique, impurities such as gold (Au), vanadium (V), cobalt (Co), zinc (Zn), and copper (Cu) ions are interspersed among the silicon atoms via implantation, diffusion, or other mechanism. The impurities also trap free carriers, reducing the carrier lifetime. In one embodiment, the top portion 30 may be subjected to deep trap impurities until the top portion 30 has an impurity density sufficient to impair the ability of the top portion 30 to behave like a semiconductor. In one embodiment, the top portion 30 has been modified to have an impurity density in a range from $1e15/cm^3$ to $1e18/cm^3$.

Neutron irradiation is yet another way to treat the top portion 30 of silicon substrate 24 in order to reduce carrier lifetime. Other techniques that reduce the carrier lifetime of the top portion 30 relative to other portions of the silicon substrate 24 are also contemplated, including combinations of any of the above treatments. For example, polycrystalline silicon may be combined with oxygen doping to produce oxygen-doped polycrystalline silicon. Other combinations are contemplated. In one embodiment, the top portion 30 has a carrier lifetime of less than 100 nanoseconds. With such a short carrier lifetime, the top portion 30 resists or is immune to the creation of the inversion layer to which the conventional bonded wafer 10 is susceptible.

In one embodiment, the wafer includes a dielectric overlay, insulation, or passivation layer, which may help reduce the temperature sensitivity of the SAW device. In one embodiment, the overlay can include silicon oxide which can be doped with for example Fluorine or Boron compounds to reduce further the temperature sensitivity. If silicon oxide is present between the substrate and piezoelectric film it can be doped as well.

Figure 4:
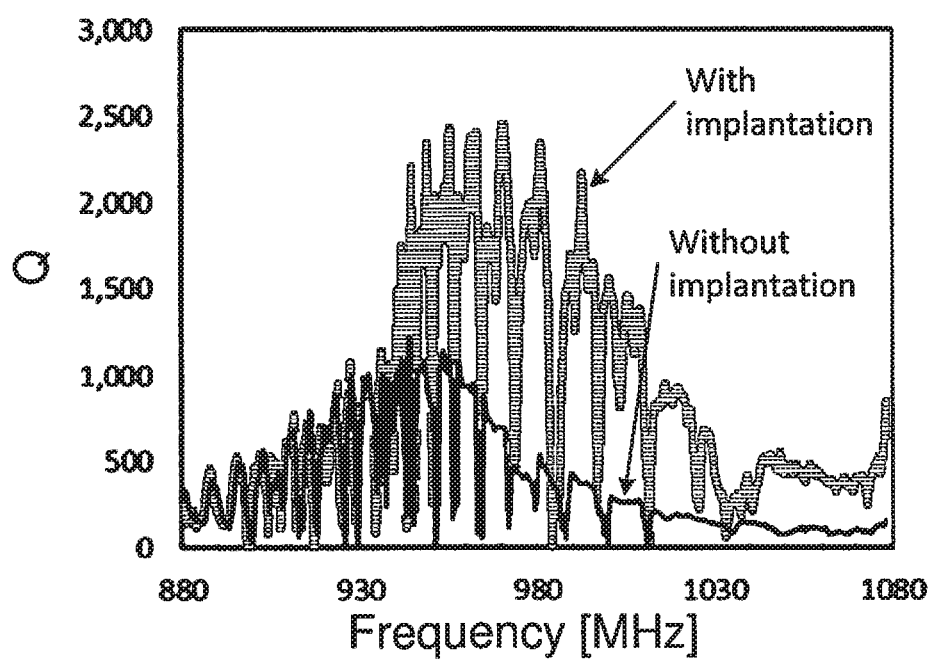
FIG. 4 is a graph comparing the performance of a SAW device made using a bonded wafer 20 versus one made using an exemplary bonded wafer 22 that has been treated via damage implantation.

FIG. 4 is a graph comparing the performance of a SAW device made using a bonded wafer 20 without any treatments to reduce the carrier lifetime versus one made using an exemplary bonded wafer 22 that has been treated via damage implantation. FIG. 4 shows the value of Q over a range of frequencies from 880 MHz to 1080 MHz. The solid line represents the value of Q for a bonded wafer 20 without implantation and the patterned line represents the value of Q for an exemplary bonded wafer 22 with damage implantation. It can be seen that the values of Q for the exemplary bonded wafer 22 are generally much higher than for the bonded wafer 20.

In one embodiment, bonded wafer 22 may include additional layers between the piezoelectric layer 32 and the silicon substrate 24. One example of this is shown in FIG. 5.

Figure 5:
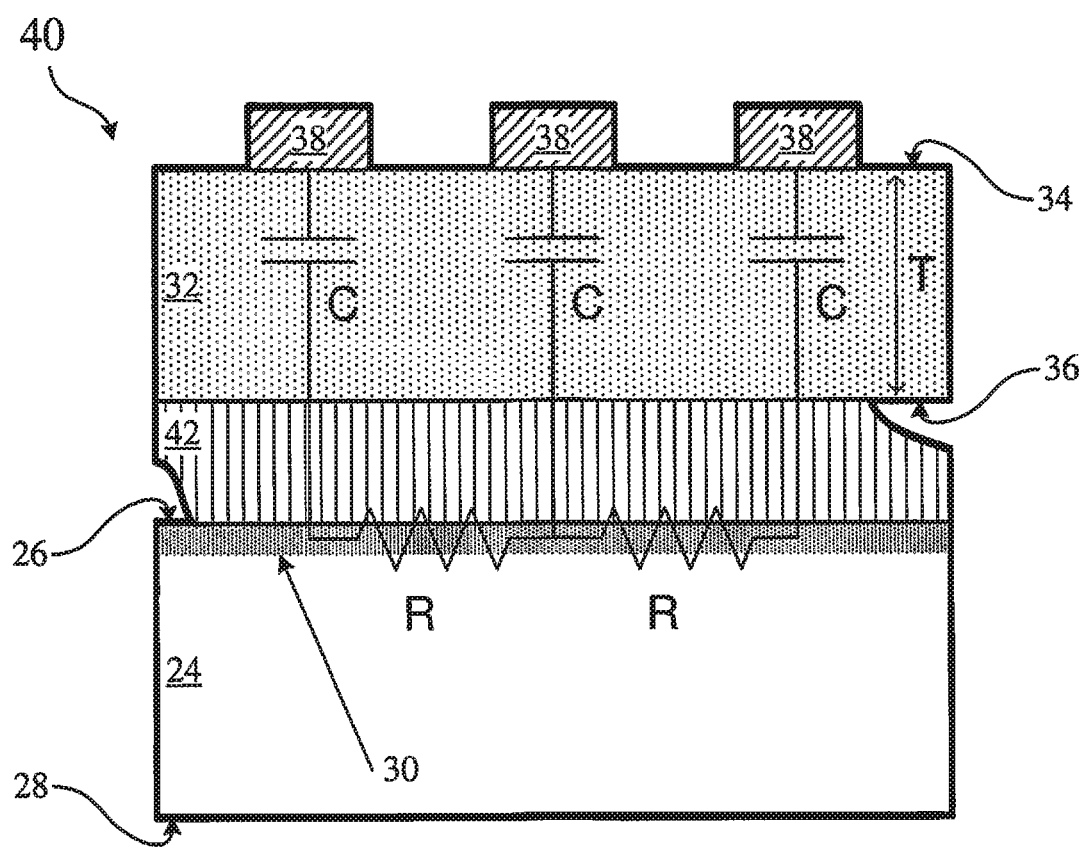
FIG. 5 illustrates a cross-section view of an exemplary bonded wafer with low carrier lifetime in silicon according to another embodiment of the subject matter described herein.

FIG. 5 illustrates a cross-section view of an exemplary bonded wafer with low carrier lifetime in silicon according to another embodiment of the subject matter described herein. In the embodiment illustrated in FIG. 5, an exemplary bonded wafer 40 includes the silicon substrate 24 having the opposing top surface 26 and bottom surface 28. The top 26 of the silicon substrate 24 has been modified or treated to reduce the carrier lifetime in the top portion 30 of the silicon substrate 24 relative to the carrier lifetime in portions of the silicon substrate 24 other than the top portion 30. The exemplary bonded wafer 40 also has the piezoelectric layer 32 having the opposing top surface 34 and bottom surface 36 and a thickness, T.

In the embodiment illustrated in FIG. 5, the exemplary bonded wafer 40 includes an insulation layer 42 between the piezoelectric layer 32 and the silicon substrate 24. In one embodiment, the insulation layer 42 is comprised of silicon oxide ($SiO_x$), where x is normally close to 2 (i.e., silicon dioxide, or $SiO_2$) but can vary, or other insulating material. Additionally, this silicon oxide layer can be doped with, for example, fluorine or boron compounds to reduce temperature sensitivity of the device. Here, also, the relative thicknesses of the silicon substrate 24, its top portion 30 (also referred to herein as the low carrier lifetime portion 30), the insulation layer 42, and the piezoelectric layer 32 are also not to scale.

Figure 6:
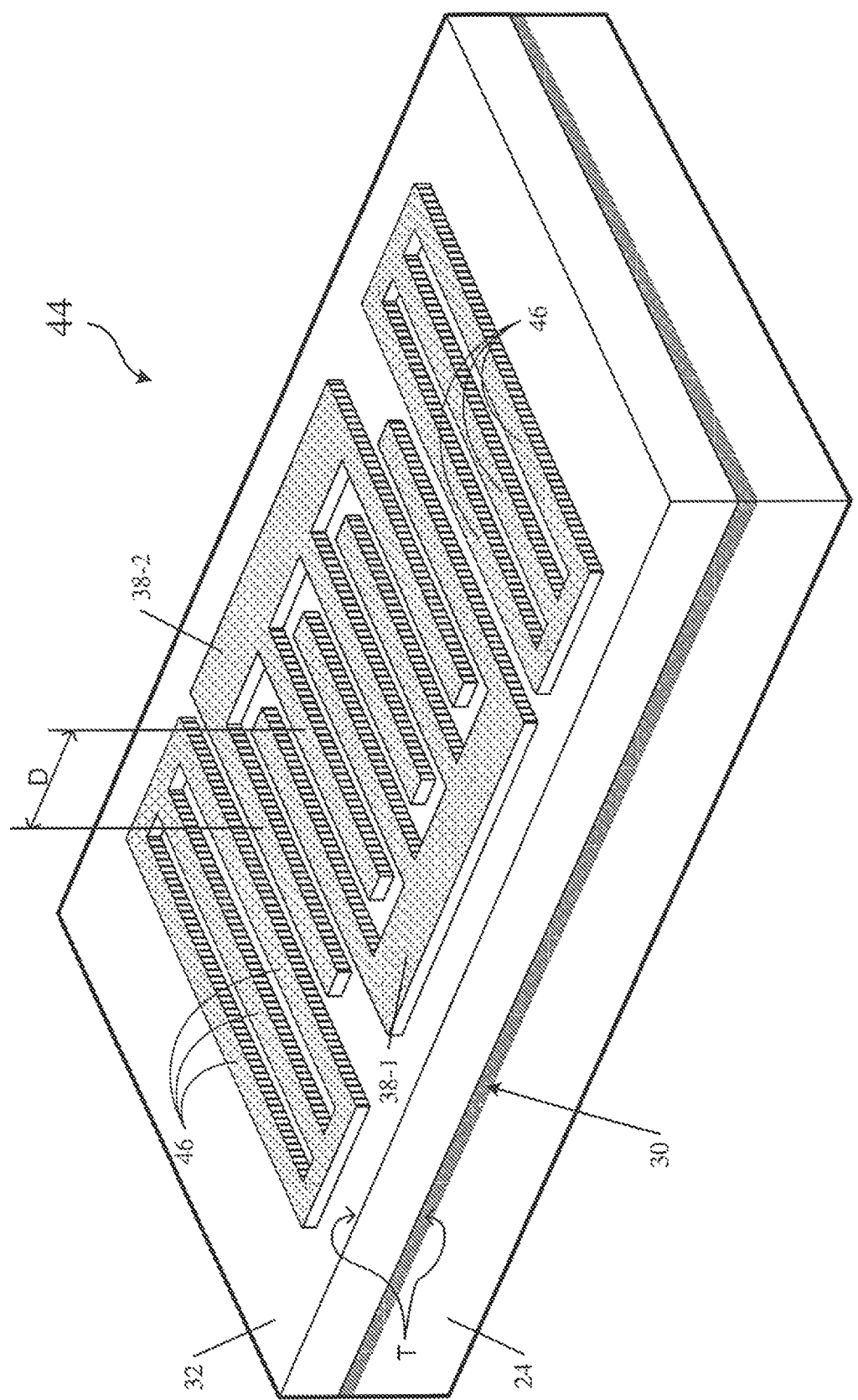
FIG. 6 is an isometric view of a SAW device according to another embodiment of the subject matter described herein.

FIG. 6 is an isometric view of a SAW device according to another embodiment of the subject matter described herein. In the embodiment illustrated in FIG. 6, a SAW resonator 44 includes the silicon substrate 24, the top of which has been treated or modified to reduce the carrier lifetime in the top portion 30 of the silicon substrate 24 relative to the carrier lifetime in portions of the silicon substrate 24 other than the top portion 30, which prevents the creation of a parasitic conductance at the top of the silicon substrate 24 during operation of the SAW device. Bonded above the silicon substrate 24 is the piezoelectric layer 32 of thickness T and having opposing top and bottom surfaces. Various types of SAW elements may be formed on the top surface of the piezoelectric layer 32. The piezoelectric layer 32 may be any piezoelectric material such as, for example, quartz, lithium niobate ($LiNbO_3$), or lithium tantalate ($LiTaO_3$). In the embodiment illustrated in FIG. 6, the SAW resonator 44 includes a first pair of electrodes 38-1 and 38-2 forming an Interdigitated Transducer (IDT). Each electrode 38-1 and 38-2 includes multiple fingers having a center-to-center distance D, where D=λ, the wavelength of the center operating frequency of the SAW resonator 44. Because the electrodes are interdigitated, the center-to-center distance D for each electrode is twice distance between adjacent electrodes, i.e., D is twice the period. The IDTs generally have a much larger number of fingers than depicted; the number of fingers has been significantly reduced in the drawing figures in an effort to more clearly depict the overall concepts employed in available SAW architectures as well as the concepts provided by the present disclosure. Additional fingers 46 on each side of the IDT electrodes 38-1 and 38-2 comprise reflectors. For simplicity, only a very simple device is represented in FIG. 6 and other figures, but any kind of SAW device such as, for example, a resonator, a coupled resonator filter, a ladder filter, an impedance element filter or a duplexer can used.

FIG. 6 illustrates the point that due to the presence of the low carrier lifetime portion 30 at the top of the silicon substrate 24, the piezoelectric layer 32 can be thin (e.g., T<(2×λ)) without degradation of the Q of the SAW resonator 44, something that is not possible with bonded wafers 20. In the embodiment illustrated in FIG. 6, for example, T is approximately equal to λ, but using the exemplary bonded wafer 22, T can be as low as 0.10×λ without affecting Q. In one embodiment, T<(2×λ). In one embodiment, T<(1.76− 2.52e−4*($V_{SUB}$+4210−$V_{PIEZO}$))*D. Typical values for $V_{SUB}$ range from 4210~6984, depending on the substrate material.

It should be noted that the measurements listed above in terms of λ may also be made in terms of D. For example, in one embodiment, the thickness of T of the piezoelectric layer 32 may be less than 2*D. In another embodiment, T is greater than 0.10*D. From an operational standpoint, T may be defined in terms of λ and vice-versa; from a structural standpoint, T may be defined in terms of D and vice-versa. For the figures below, T is defined in terms of D for convenience but could also be defined in terms of λ instead.

Figure 7:
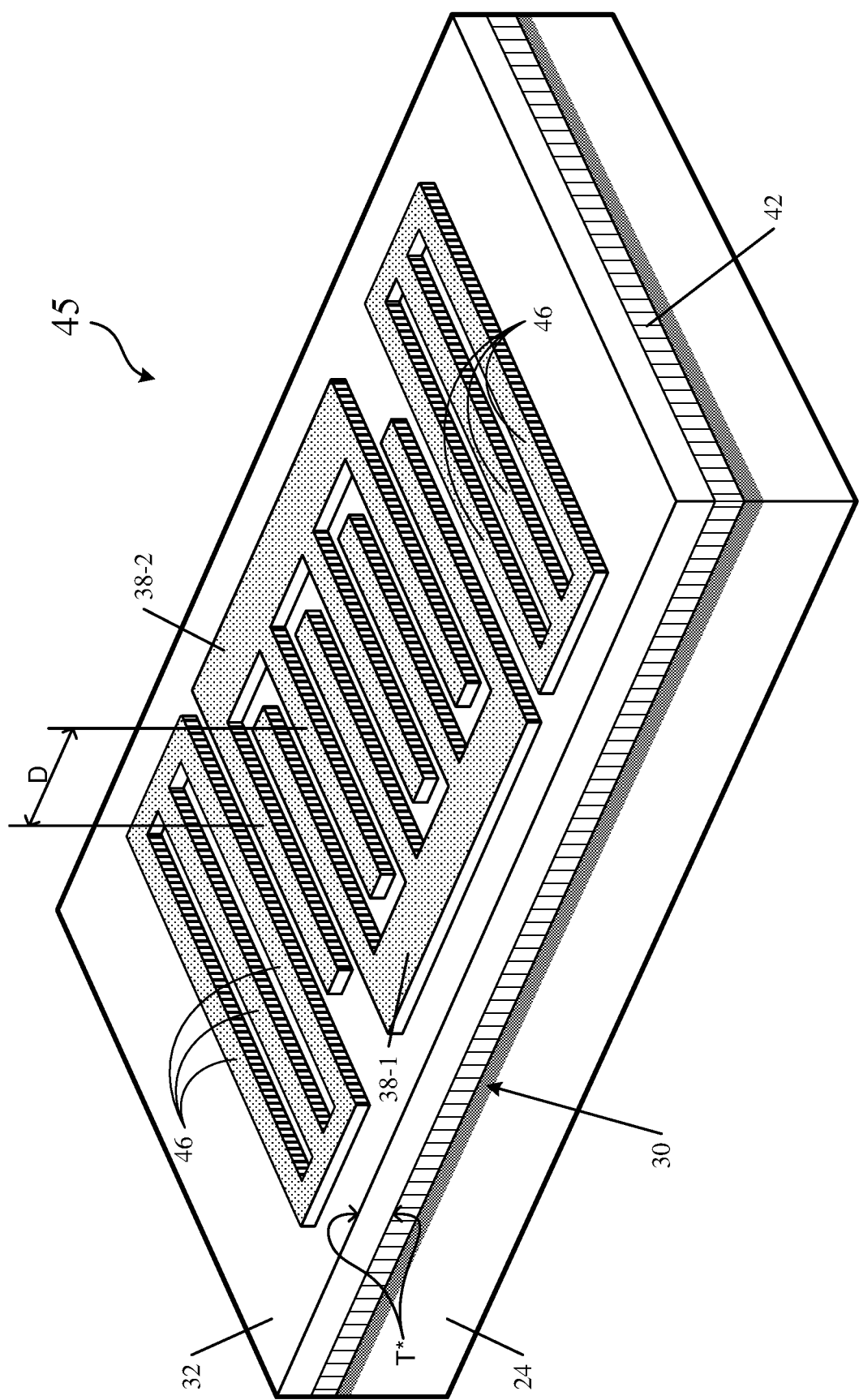
FIG. 7 is an isometric view of a SAW device according to another embodiment of the subject matter described herein.

FIG. 7 is an isometric view of a SAW resonator 45 according to another embodiment of the subject matter described herein. In the embodiment illustrated in FIG. 7, the SAW resonator 45 includes the silicon substrate 24, the top portion of which has been treated or modified to create a low carrier lifetime portion 30. Above the silicon substrate 24 is the insulation layer 42 having a thickness $T_I$, which is bonded to the piezoelectric layer 32 having a thickness $T_P$. The SAW resonator 45 illustrated in FIG. 7 is substantially identical to the SAW resonator 44 illustrated in FIG. 6, except that the SAW resonator 45 is built on a bonded wafer that includes an insulation layer 42.

FIG. 7 illustrates the point that, due to the presence of both the low carrier lifetime portion 30 at the top of the silicon substrate 24 and the insulation layer 42, the piezoelectric layer 32 can be very thin, e.g., $T_P > (0.05*D)$, without affecting Q.

Figure 8A:
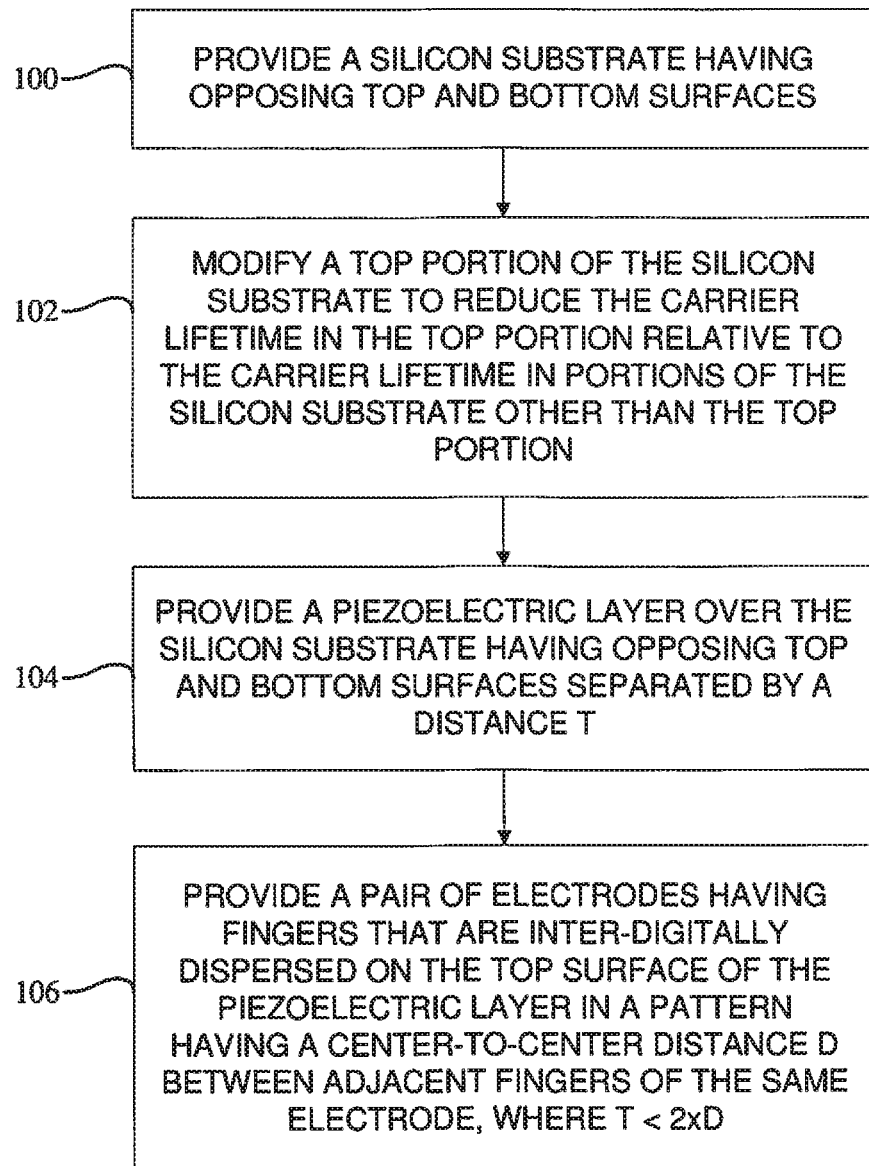
FIGS. 8A and 8B are flow charts illustrating exemplary processes for fabricating a bonded wafer with low carrier lifetime according to an embodiment of the subject matter described herein.

FIG. 8A is a flow chart illustrating an exemplary process for fabricating a bonded wafer with low carrier lifetime according to an embodiment of the subject matter described herein. In the embodiment illustrated in FIG. 8A, the process includes: providing a silicon substrate having opposing top and bottom surfaces (step 100); modifying the silicon in a top portion of the silicon substrate to reduce the carrier lifetime in the top portion relative to the carrier lifetime in portions of the silicon substrate other than the top portion (step 102); providing a piezoelectric layer over the silicon substrate having opposing top and bottom surfaces separated by a distance T (step 104); and providing a pair of electrodes having fingers that are inter-digitally dispersed on the top surface of the piezoelectric layer in a pattern having a center-to-center distance D between adjacent fingers of the same electrode, where $T<2*D$ (step 106).

In one embodiment, the method of fabricating a bonded wafer with low carrier lifetime includes bonding the piezoelectric layer to the silicon substrate. The piezoelectric layer may be formed by bonding a piezoelectric wafer on the substrate and by reducing its thickness by mechanical grinding/polishing.

Figure 8B:
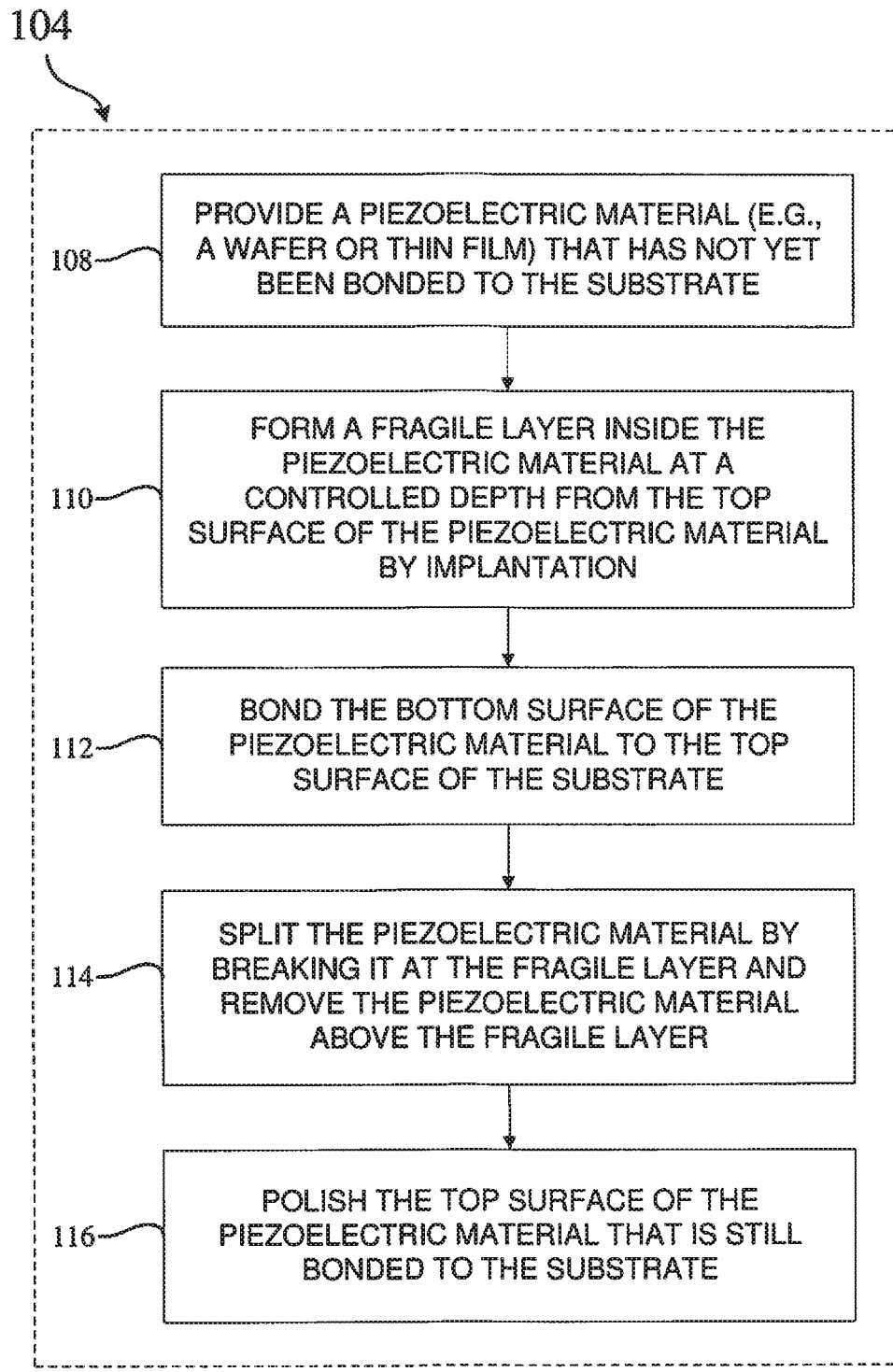

FIG. 8B is a flow chart illustrating in more detail step 104 of FIG. 8A according to an embodiment of the subject matter described herein. In the embodiment illustrated in FIG. 8B, providing a piezoelectric layer over the silicon substrate starts with providing a piezoelectric material, such as a wafer or film, that has not yet been bonded to the substrate (step 108); forming a fragile layer inside the piezoelectric material at a controlled depth from the top surface of the piezoelectric material by implantation (step 110); bonding the bottom surface of the piezoelectric material to the top surface of the substrate (step 112); splitting the piezoelectric material by breaking it at the fragile layer and removing the piezoelectric material above the fragile layer (step 114); and polishing the top surface of the piezoelectric material that is still bonded to the substrate (step 116), e.g., polishing the surface of that was previously part of the internal fragile layer. In one embodiment, thermal stress may be used to split the piezoelectric material at the fragile layer.

In one embodiment, modifying the top portion of the silicon substrate comprises modifying the top portion of the silicon substrate to be non-monocrystalline. In one embodiment, modifying the top portion of the silicon substrate to be non-monocrystalline comprises modification by damage implantation. In one embodiment, modification by damage implantation comprises implantation of silicon ions, argon ions, nitrogen ions, oxygen ions, neon ions, beryllium ions, carbon ions, krypton ions, and/or protons.

In one embodiment, modifying the top portion of the silicon substrate to be non-monocrystalline comprises modification by the growth or deposition of polycrystalline silicon, nanocrystalline silicon, and/or amorphous silicon.

In one embodiment, modifying the top portion of the silicon substrate comprises modifying the top portion of the silicon substrate to include deep trap impurities. In one embodiment, the deep trap impurities comprise gold ions, vanadium ions, cobalt ions, zinc ions, and/or copper ions.

In one embodiment, modifying the top portion of the silicon substrate includes modifying the top portion of the silicon substrate to have a low carrier lifetime relative to the carrier lifetime within portions of the silicon substrate other than the top portion.

In one embodiment, the modification of the top portion prevents the creation of a parasitic conductance within the top of the silicon substrate during operation of a surface acoustic wave device built using the exemplary bonded wafer.

In one embodiment, the method of fabrication includes providing an insulation layer between the silicon substrate and the piezoelectric layer. In these embodiments, the method includes bonding the piezoelectric layer to the insulation layer.

FIGS. 9A and 9B are graphs illustrating the performance of the exemplary bonded wafer 40 with different thicknesses of the piezoelectric layer 32 and the insulation layer 42 according to embodiments of the subject matter described herein. The thickness T of the piezoelectric layer 32 is shown on the X axis and the characteristic being simulated is displayed on the Y axis. Each curve represents the performance of a bonded wafer with a different thickness of the insulation layer 42 in terms of $\lambda$.

In FIG. 9A, the value of $K^2$ is shown as a percentage on the Y axis. FIG. 9A shows that $K^2$ values as high as 8% can be achieved with no insulation layer ($SiO_2=0.00\lambda$) even when T is $0.10\lambda$. With the addition of a small insulation layer ($SiO_2>0.02\lambda$), comparable $K^2$ values can be achieved even when T is $0.05\lambda$. In the graph illustrated in FIG. 9A, $T=0.15\lambda$ is an optimal thickness of the piezoelectric layer 32.

In FIG. 9B, the value of resonance frequency f is shown in megahertz (MHz) on the Y axis. FIG. 9B shows that a $SiO_2$ thickness of $0.08\lambda$ has a relatively flat response with variation of thickness T of the piezoelectric layer 32 around the target thickness $T=0.15\lambda$. In other words, a process variation of T between $0.10\lambda$ and $0.20\lambda$ will cause only a slight variation of the resonance frequency of ~950 MHz.

FIGS. 10A and 10B are graphs showing how proper selection of piezoelectric layer thickness can further improve the performance of the SAW device according to embodiments of the subject matter described herein.

FIGS. 10A and 10B show the simulated admittance and conductance of a guided SAW resonator built using the exemplary bonded wafer 22, for example. Conductance rapidly increases at the cutoff frequency because, above the cutoff frequency, the bulk acoustic wave is not contained within the piezoelectric layer 32 but instead disperses into the silicon substrate 24. The cutoff frequency is a function of the velocity in the support substrate ($V_{SUB}$), which is itself a function of the support substrate material: higher velocity means a higher cutoff frequency. In FIGS. 10A and 10B, the cutoff frequency is about 1.18 GHz for a silicon substrate.

The frequency of the spurious modes, however, is influenced by the thickness T of the piezoelectric layer 32. FIG. 10A shows that, for $T=0.7\lambda$, spurious modes appear between 1.1 GHz and 1.2 GHz. FIG. 10B shows that if T is reduced to $0.5\lambda$ the spurious modes appear between 1.2 GHz and 1.3 GHz, i.e., at a frequency higher than the cutoff frequency, which causes those modes to be suppressed. Because the cutoff frequency is not dependent upon T, T may be adjusted to frequency-shift the spurious modes into a frequency above the cutoff frequency, where the spurious modes will be suppressed. Thus, by thoughtful selection of T, the overall performance of a SAW resonator may be improved. For suppression of spurious modes, it has been determined by simulation that T should be less than about $(1.76-2.52e-4*(V_{SUB}+4210-V_{PIEZO}))*D$. For bonded wafers with an insulation layer having a thickness $T_I$, thickness of the piezoelectric layer T should be less than about $(1.76-2.52e-4*(V_{SUB}+4210-V_{PIEZO})-0.50*T_I)*D$. In one embodiment, $T_I$, is less than $(0.1*D)$. Since different substrate materials have different values for $V_{SUB}$, the thickness of the piezoelectric layer 32 needed to suppress the spurious modes would differ from substrate material to substrate material. For example: for silicon, T should be less than about $0.60\lambda$; for sapphire, T should be less than about $0.25\lambda$ when 42LT is used as a piezoelectric layer.

The equations above are for general purpose including lithium tantalate, lithium niobate, quartz, and other piezoelectric materials as a piezoelectric layer. However, for rotated Y-cut lithium tantalate (LT) layer, for example, the value of $V_{PIEZO}$ varies depending upon the cut angle θ. The following equations should be used to determine a maximum thickness of the piezoelectric layer for suppression of spurious modes based on the cut angle of the rotated Y-cut LT layer:

$$T<(1.76-2.52\times10^{-4}\times(V_{SUB}+4210-(-2.435\times10^{-9}\theta^6+1.103\times10^{-6}\theta^5-1.719\times10^{-4}\theta^4+1.145\times10^{-2}\theta^3-4.229\times10^{-1}\theta^2+9.765\theta+4.103\times10^3)))\times\text{lambda}$$

for bonded wafers without an insulation layer, and $$T<(1.76-2.52\times10^{-4}\times(V_{SUB}+4210-(-2.435\times10^{-9}\theta^6+1.103\times10^{-6}\theta^5-1.719\times10^{-4}\theta^4+1.145\times10^{-2}\theta^3-4.229\times10^{-1}\theta^2+9.765\theta+4.103\times10^3))-0.50\times T_I)\times\text{lambda}$$

for bonded wafers with an insulation layer having a thickness $T_I$.

FIG. 11 is a flow chart illustrating an exemplary process for fabricating a bonded wafer with low carrier lifetime according to another embodiment of the subject matter described herein. In the embodiment illustrated in FIG. 11, the process includes: providing a silicon substrate having opposing top and bottom surfaces (step 200); providing, over the top surface of the silicon substrate, a piezoelectric layer having opposing top and bottom surfaces separated by a distance T (step 202); thinning and/or polishing the piezoelectric layer (step 204); and performing damage implantation or deep trap ion implantation of the top surface of the silicon substrate through the piezoelectric layer (step 206). FIG. 11 illustrates the point that the damage implantation or deep trap ion implantation step can be performed after the piezoelectric layer has been provided onto the top surface of the silicon substrate. In one embodiment, providing a piezoelectric layer over the top surface of the silicon substrate may comprise bonding the piezoelectric layer to the top surface of the silicon substrate.

FIG. 12 is a flow chart illustrating an exemplary process for fabricating a bonded wafer with low carrier lifetime according to yet another embodiment of the subject matter described herein. In the embodiment illustrated in FIG. 12, the process includes: providing a silicon substrate having opposing top and bottom surfaces (step 300); providing an insulation layer over the top surface of the silicon substrate (step 302); providing, over the top surface of the insulation layer, a piezoelectric layer having opposing top and bottom surfaces separated by a distance T (step 304); thinning and/or polishing the piezoelectric layer (step 306); and performing damage implantation or deep trap ion implantation of the top surface of the silicon substrate through both the piezoelectric layer and the insulation layer (step 308). FIG. 12 illustrates the point that the damage implantation or deep trap ion implantation step can be performed after both an insulating layer and the piezoelectric layer has been provided onto the top surface of the silicon substrate. In one embodiment, providing the insulation layer over the top of the silicon substrate may comprise growing a silicon dioxide (or other oxide layer) on the top surface of the silicon substrate. It may also comprise bonding an insulating material to the top surface of the silicon substrate. In one embodiment, providing a piezoelectric layer over the top surface of the insulation layer may comprise bonding the piezoelectric layer to the top surface of the insulation layer.

FIG. 13 is a flow chart illustrating an exemplary process for fabricating a bonded wafer with low carrier lifetime according to still another embodiment of the subject matter described herein. In the embodiment illustrated in FIG. 13, the process includes: providing a silicon substrate having opposing top and bottom surfaces (step 400); providing an insulation layer over the top of the silicon substrate (step 402); performing damage implantation or deep trap ion implantation of the top surface of the silicon substrate through the insulation layer (step 404); providing, over the top surface of the insulation layer, a piezoelectric layer having opposing top and bottom surfaces separated by a distance T (step 406); and thinning and/or polishing the piezoelectric layer (step 408). FIG. 13 illustrates the point that the damage implantation or deep trap ion implantation step can be performed after an insulating layer has been provided onto the top surface of the silicon substrate but before the piezoelectric layer is provided over the top surface of the insulation layer. In one embodiment, providing the insulation layer over the top of the silicon substrate may comprise growing a silicon dioxide (or other oxide layer) on the top surface of the silicon substrate. It may also comprise bonding an insulating material to the top surface of the silicon substrate. In one embodiment, providing a piezoelectric layer over the top surface of the insulation layer may comprise bonding the piezoelectric layer to the top surface of the insulation layer.

It will be understood that the principles described above with respect to any particular SAW device, such as a resonator, also apply to other types of devices, including, but not limited to, ladder filters, impedance element filters, coupled resonator filters, or any combination of the above, as well as to duplexers and filters included inside duplexers.

Those skilled in the art will recognize improvements and modifications to the preferred embodiments of the present disclosure. All such improvements and modifications are considered within the scope of the concepts disclosed herein and the claims that follow.

What is claimed is:
1. A method of fabricating a bonded wafer with low carrier lifetime in silicon, the method comprising:
   providing a silicon substrate having opposing top and bottom surfaces;
   modifying a top portion of the silicon substrate to impair an ability of the top portion to behave like a semiconductor by forming locations in the top portion which trap free carriers;

providing a piezoelectric layer over the top surface of the silicon substrate, the piezoelectric layer having opposing top and bottom surfaces separated by a distance T; and providing a pair of electrodes having fingers that are inter-digitally dispersed on the top surface of the piezoelectric layer in a pattern having a center-to-center distance D between adjacent fingers of the same electrode, the electrodes comprising a portion of a Surface Acoustic Wave (SAW) device, the modified top portion of the silicon substrate preventing creation of a parasitic conductance within the top portion of the silicon substrate during operation of the SAW device, wherein modifying the top portion of the silicon substrate comprises providing metal ions in the top portion of the silicon substrate that cause deep trap impurities to be included in the top portion of the silicon substrate.

2. The method of claim 1 wherein a thickness of the modified top portion is at least 10 nanometers.

3. The method of claim 1 wherein a thickness of the modified top portion is at least 50 nanometers.

4. The method of claim 1 wherein a thickness of the modified top portion is at least 200 nanometers.

5. The method of claim 1 wherein providing the piezoelectric layer comprises providing a layer comprising at least one of quartz, lithium niobate ($LiNbO_3$), or lithium tantalate ($LiTaO_3$).

6. The method of claim 1 wherein $T<(2*D)$.

7. The method of claim 1 wherein $T>(0.10*D)$.

8. The method of claim 1 wherein:

$$T<(1.76-2.52e-4*(V_{SUB}+4210-V_{PIEZO}))*D;$$

$V_{SUB}$ is a velocity of a slowest acoustic wave in a propagation direction in the silicon substrate; and $V_{PIEZO}$ is a SAW velocity in the piezoelectric layer.

9. The method of claim 1 further comprising providing an insulation layer between the silicon substrate and the piezoelectric layer, wherein providing the metal ions in the top portion of the silicon substrate comprises one of:

implanting the metal ions through the insulation layer and into the top portion of the silicon substrate;

implanting the metal ions through the piezoelectric layer and into the top portion of the silicon substrate; or implanting the metal ions through the piezoelectric layer and the insulation layer and into the top portion of the silicon substrate.

10. A method of fabricating a bonded wafer with low carrier lifetime in silicon, the method comprising:

providing a silicon substrate having opposing top and bottom surfaces;

providing an insulation layer over the top surface of the silicon substrate;

modifying a top portion of the silicon substrate to impair an ability of the top portion to behave like a semiconductor by forming locations in the top portion which trap free carriers;

providing a piezoelectric layer over a top surface of the insulation layer, the piezoelectric layer having opposing top and bottom surfaces separated by a distance T; and providing a pair of electrodes having fingers that are inter-digitally dispersed on the top surface of the piezoelectric layer in a pattern having a center-to-center distance D between adjacent fingers of the same electrode, the electrodes comprising a portion of a Surface Acoustic Wave (SAW) device, the modified top portion of the silicon substrate preventing creation of a parasitic conductance within the top portion of the silicon substrate during operation of the SAW device, wherein modifying the top portion of the silicon substrate comprises implanting ions through at least the insulation layer and into the top portion of the silicon substrate.

11. The method of claim 10 wherein:

the silicon substrate is monocrystalline; and implanting the ions into the top portion of the silicon substrate causes the top portion to comprise a non-monocrystalline structure having the locations which trap free carriers.

12. The method of claim 11 wherein the top portion is modified to have a defect density in a range from $1e17/cm^3$ to $1e22/cm^3$.

13. The method of claim 11 wherein modifying the top portion of the silicon substrate comprises implanting the ions through the piezoelectric layer and the insulation layer and into the top portion of the silicon substrate.

14. The method of claim 13 wherein the ions are implanted across a thickness of the top portion of the silicon substrate.

15. The method of claim 13 wherein implanting the ions into the top portion of the silicon substrate causes a defect density in a range from $1e17/cm^3$ to $1e22/cm^3$.

16. The method of claim 10 wherein implanting the ions into the top portion of the silicon substrate comprises implanting metal ions into the top portion of the silicon substrate that cause deep trap impurities to be included in the top portion of the silicon substrate.

17. The method of claim 16 wherein the top portion is modified to have an impurity density in a range from $1e15/cm^3$ to $1e18/cm^3$.

18. The method of claim 10 wherein the modified top portion has a carrier lifetime of less than 100 nanoseconds.

19. A method of fabricating a bonded wafer with low carrier lifetime in silicon, the method comprising:

providing a silicon substrate having opposing top and bottom surfaces;

modifying a top portion of the silicon substrate to reduce carrier lifetime across a thickness of the top portion relative to a carrier lifetime in portions of the silicon substrate other than the top portion;

providing a piezoelectric layer over the top surface of the silicon substrate, the piezoelectric layer having opposing top and bottom surfaces separated by a distance T; and providing a pair of electrodes having fingers that are inter-digitally dispersed on the top surface of the piezoelectric layer in a pattern having a center-to-center distance D between adjacent fingers of the same electrode, the electrodes comprising a portion of a Surface Acoustic Wave (SAW) device, the modified top portion of the silicon substrate preventing creation of a parasitic conductance within the top portion of the silicon substrate during operation of the SAW device, wherein modifying the top portion of the silicon substrate comprises providing metal ions in the top portion of the silicon substrate that cause deep trap impurities to be included within the top portion of the silicon substrate.

20. The method of claim 19 further comprising providing an insulation layer between the silicon substrate and the piezoelectric layer, wherein the modifying and providing the insulation layer steps are performed in any order.

21. The method of claim 20 wherein providing the insulation layer comprises providing a layer of silicon oxide.

22. The method of claim 21 further comprising doping the layer of silicon oxide with Fluorine or Boron compounds to reduce thermal sensitivity of the SAW device.

23. The method of claim 20 wherein a thickness of the insulation layer is greater than (0.02*D).

24. The method of claim 23 wherein providing the insulation layer comprises providing a layer of silicon oxide.

25. The method of claim 20 wherein:

$$T<(1.76-2.52e-4*(V_{SUB}+4210-V_{PIEZO})-(0.50*T_I))*D;$$

$V_{SUB}$ is a velocity of a slowest acoustic wave in a propagation direction in the silicon substrate;

$V_{PIEZO}$ is a SAW velocity in the piezoelectric layer; and $T_I$ is a thickness of the insulation layer.

26. The method of claim 20 wherein a thickness of the insulation layer is less than (0.1*D).

27. The method of claim 19 further comprising embedding or covering the pair of electrodes by at least one dielectric, insulation, or passivation layer.

28. The method of claim 27 further comprising doping the at least one dielectric, insulation, or passivation layer with Fluorine or Boron compounds.

29. The method of claim 28 wherein doping the at least one of the insulation layer, the dielectric layer, or the passivation layer with Fluorine or Boron compounds reduces thermal sensitivity of the SAW device.

* * * * *